United States Patent
Woeste et al.

(10) Patent No.: US 6,232,806 B1
(45) Date of Patent: May 15, 2001

(54) MULTIPLE-MODE CLOCK DISTRIBUTION APPARATUS AND METHOD WITH ADAPTIVE SKEW COMPENSATION

(75) Inventors: Dana Marie Woeste; James David Strom; Bruce George Rudolph, all of Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/177,142

(22) Filed: Oct. 21, 1998

(51) Int. Cl.[7] ............................................. H03K 7/06
(52) U.S. Cl. ........................ 327/149; 327/152; 327/153
(58) Field of Search ................................... 327/149, 150, 327/153, 158, 159, 244, 161, 291, 292, 295, 261, 262, 270, 3

(56) References Cited

U.S. PATENT DOCUMENTS

| | | | |
|---|---|---|---|
| 5,043,596 | * 8/1991 | Masuda et al. | 327/276 |
| 5,491,441 | 2/1996 | Goetschel et al. | 327/291 |
| 5,969,553 | * 10/1999 | Kishi et al. | 327/159 |
| 5,973,525 | * 10/1999 | Fujii | 327/158 |
| 5,990,715 | * 10/1999 | Nishimura | 327/158 |
| 5,990,719 | * 10/1999 | Dai et al. | 327/244 |

OTHER PUBLICATIONS

S. J. Baumgartner et al., "Clock Distribution Method," *IBM Technical Disclosure Bulletin*, 32:10A (1990).

D. R. Cecchi et al., Paper FP 20.2 "A 1GB/S SCI Link in 0.8 μm BiCMOS," Session 20, RF/Baseband Processing, 1995 IEEE International Solid–State Circuits Conference.

C. J. Goetschel et al., "Programmable Delay Line," *IBM Technical Disclosure Bulletin*, 37:03 (1994).

R. Gopalan et al., "High–Speed Clock System Design with the ML6500 PACMan Programmable Adaptive Clock Manager," Application Note 21 of Micro Linear Corporation, pp. 1–16 (1993).

D. Woeste et al., Paper FA 8.4 "Digital–Phase Aligner Macro for Clock Tree Compensation with 70ps Jitter," Session 8, Digital Clocks and Latches, 1996 IEEE International Solid–State Circuits Conference.

B. Wüppermann et al., Paper TP 9.1 "A 16–PSK Modulator with Phase Error Correction," Session 9, Radio Communication Circuits, 1993 IEEE International Solid–State Circuits Conference.

* cited by examiner

*Primary Examiner*—Tuan T. Lam
*Assistant Examiner*—Hiep Nguyen
(74) *Attorney, Agent, or Firm*—Mark A. Hollingsworth; Mueting & Raasch

(57) ABSTRACT

An apparatus and method for distributing a clock signal within circuitry disposed on a number of separate system cards includes a first system card that generates a reference clock signal representative of a fixed delay of a system clock signal. A number of variable clock signals are produced using the system clock signal. Each of a number of system cards separate from the first system card receive one of the variable clock signals. A delay associated with the reference clock signal is typically longer than a delay associated with each of the variable clock signals. The phase of each of the variable clock signals is adjusted to a substantially in-phase relationship with respect to the reference clock signal in response to a phase difference between the reference clock signal an output signal received from each of the separate system cards. Producing each of the variable clock signals may involve selecting between a first delay line and a second delay line, and then producing the variable delay signal using the selected first or second delay line. A delay factor of the non-selected first or second delay line may be changed by varying a resistance and a current of one or more delay elements of the non-selected first or second delay lines. The circuitry is selectably operable in a slave or buffer-type clock repowering mode or an adaptive mode. The variable clock signals and the output signals may respectively comprise low voltage differential signals (LVDS) or CMOS level signals.

37 Claims, 23 Drawing Sheets

MULTIPLE-MODE CLOCK DISTRIBUTION APPARATUS AND METHOD WITH ADAPTIVE SKEW COMPENSATION

FIELD OF THE INVENTION

The present invention relates generally to signal distribution in digital circuits and systems and, more particularly, to clock signal distribution of in-phase clock signals within a large digital system with low chip-to-chip and card-to-card skew.

BACKGROUND OF THE INVENTION

In multiprocessor computer systems employing synchronous clocking schemes, it is generally necessary to distribute many copies of a low skew clock signal over long distances. Clock skew is regarded as a principal design parameter with regard to the design and implementation of high-speed, distributed clock systems. Clock skew is generally understood in the art as a difference in time between the rising edge of one clock pin relative to another clock pin. Clock skew is generated by differences in delay between the system clock oscillator and the clock pins. This delay typically results from a combination of the delay through different clock drivers and the time required for the clock signals to propagate down the PC board trace wires, often referred to as trace delay.

The clock driver chips employed in large digital systems are typically limited in terms of the number of driver outputs, thus requiring that several chips be connected in a parallel clock signal repowering configuration. It is possible, through careful designing, to minimize driver-to-driver skew on a single chip using various layout and circuit design techniques, such as optimizing wiring and device matching.

Clock driver skew with respect to a chip-to-chip configuration, however, is primarily a function of chip process variations, and generally can not be controlled adequately through good physical and circuit design practices. Further complicating the effort of designing multiple-chip clock distribution circuitry is card-to-card skew. Such card-to-card skew may be due to either process variations or technology variations.

A known approach to addressing chip-to-chip and card-to-card clock skew involves the use of one or more phase lock loop (PLL) circuits per chip. PLL's are typically employed in prior art designs to provide a requisite level of clock signal phase alignment. The use of PLL's in accordance with prior art approaches, however, generally complicates the clock distribution scheme, since PLL's typically require unique wiring blockage, layout, power distribution, and characterization. Additionally, crosstalk becomes a concern when using more than one PLL per chip.

There exists a keenly felt need for a clock distribution architecture that overcomes the above-noted deficiencies found in prior art implementations, and one that provides for low clock skew in chip-to-chip and card-to-card configurations. The present invention fulfills these and other needs.

SUMMARY OF THE INVENTION

The present invention is directed to an apparatus and method for distributing a signal to a number of receiving devices in a synchronous manner. In accordance with one embodiment of the present invention, a number of signals each having a respective delay are produced and transmitted to one of a number of receiving devices. The delay of each of the delayed signals is adjusted using a reference signal and an output signal provided by each receiving device such that the delayed signals are received by respective receiving devices at approximately the same time.

Adjusting the delay of the delayed signals involves adjusting a phase of each of the delayed signals to a substantially in-phase relationship with respect to the reference signal in response to a phase difference between the reference signal and each of the respective output signals. The output signals are preferably data signals. The delayed signals and the output signals may respectively represent low voltage differential signals or CMOS level signals.

The reference signal is preferably a signal having a fixed delay longer in duration than the delayed signals. Producing each of the delayed signals may involve selecting between one of a first delay line or a second delay line, and producing the delayed signal using the selected first or second delay line. A delay factor of the other one of the first or second delay lines may be adjusted by varying a resistance and a current of one or more delay elements of the other one of the first or second delay lines. A reference voltage having a substantially constant amplitude with respect to the power supply may be provided to the one or more delay elements in order to minimize delay variations due to power supply voltage variations.

In another embodiment, an apparatus and method according to the present invention is implemented in a computer or digital system for distributing a clock signal within circuitry disposed on either a single system card or on a number of separate system cards. A main system card generates a reference clock signal representative of a fixed delay of a system clock signal. A number of variable clock signals are produced using the system clock signal. Each of a number of system cards separate from the main system card receive one of the variable clock signals.

A delay associated with the reference clock signal is typically longer than a delay associated with each of the variable clock signals. The phase of each of the variable clock signals is adjusted to a substantially in-phase relationship with respect to the reference clock signal in response to a phase difference between the reference clock signal and output signal received from each of the separate system cards.

In one embodiment, producing each of the variable clock signals involves selecting between a first delay line or a second delay line, and then producing the variable delay signal using the selected first or second delay line. A delay factor of the non-selected first or second delay line may be changed by varying a resistance and a current of one or more delay elements of the non-selected first or second delay lines. A reference voltage having a substantially constant amplitude with respect to the power supply may be provided to the delay elements of the first and second delay lines to minimize unintended variations to delay characteristics due to power supply voltage variations.

An adaptive clock distribution circuit according to an embodiment of the present invention includes a master module comprising a fixed delay line and a number of variable delay line circuits. Each of the variable delay line circuits and the fixed delay line receive a system clock signal. The fixed delay line produces a delayed clock signal using the system clock signal. The master module is coupled to a primary slave module which receives the delayed clock signal from the fixed delay line, and produces a reference clock signal using the delayed clock signal. The primary slave module may be coupled to one or more separate logic devices.

The master module is coupled to a number of secondary slave modules, each of which is coupled to one or more separate logic devices. The secondary slave modules are provided on a respective system card separate from the system card provided for the master module. Each of the secondary slave modules receives a variable clock signal from one of the variable delay line circuits, and provides a slave output signal, such an output data signal, which is fed back to the master module.

The master module adjusts the variable clock signal of each of the secondary slave modules to be in substantial alignment with the reference clock signal in response to a phase difference between respective slave output signals and the reference clock signal. The variable clock signal received by each of the secondary slave modules is used for clocking respective separate logic devices.

The master module, in accordance with an embodiment of the present invention, includes a number of control circuits and a number of phase detectors. Each of the control circuits is coupled to one of the variable delay line circuits and one of the phase detectors. Each of the phase detectors receives the reference clock signal from the primary slave module and a slave output signal from one of the secondary slave modules. In response to a phase difference between the slave output signal and reference clock signal, each of the control circuits adjusts the delay of its corresponding variable delay line until the variable delay signal in substantially in-phase with the reference clock signal.

In accordance with another embodiment, each of the variable delay line circuits includes a first delay line, a second delay line, and a multiplexer coupled to respective outputs of the first and second delay lines. The first and second delay lines each include a number of delay elements. A multiplexer is coupled to respective outputs of the first and second delay lines, and selectively couples the output of one of the first or second delay lines to an output of the multiplexer. A reference voltage source may be employed to provide a reference voltage at a substantially constant amplitude with respect to the power supply to each of the delay elements.

A control circuit is coupled to the multiplexer and the first and second delay lines. The control circuit controls the multiplexer so as to produce a variable clock signal at the multiplexer output using one of the first or second delay lines. The control circuit further changes a delay factor of the other one of the first or second delay lines by varying a resistance and a current of one or more delay elements of the other one of the first or second delay lines.

A clock signal distribution approach in accordance with an embodiment of the present invention is selectably operable in a slave or buffer-type clock repowering mode of operation or an adaptive mode of operation. The variable clock signals and the output signals may respectively comprise low voltage differential signals or CMOS level signals.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1A:
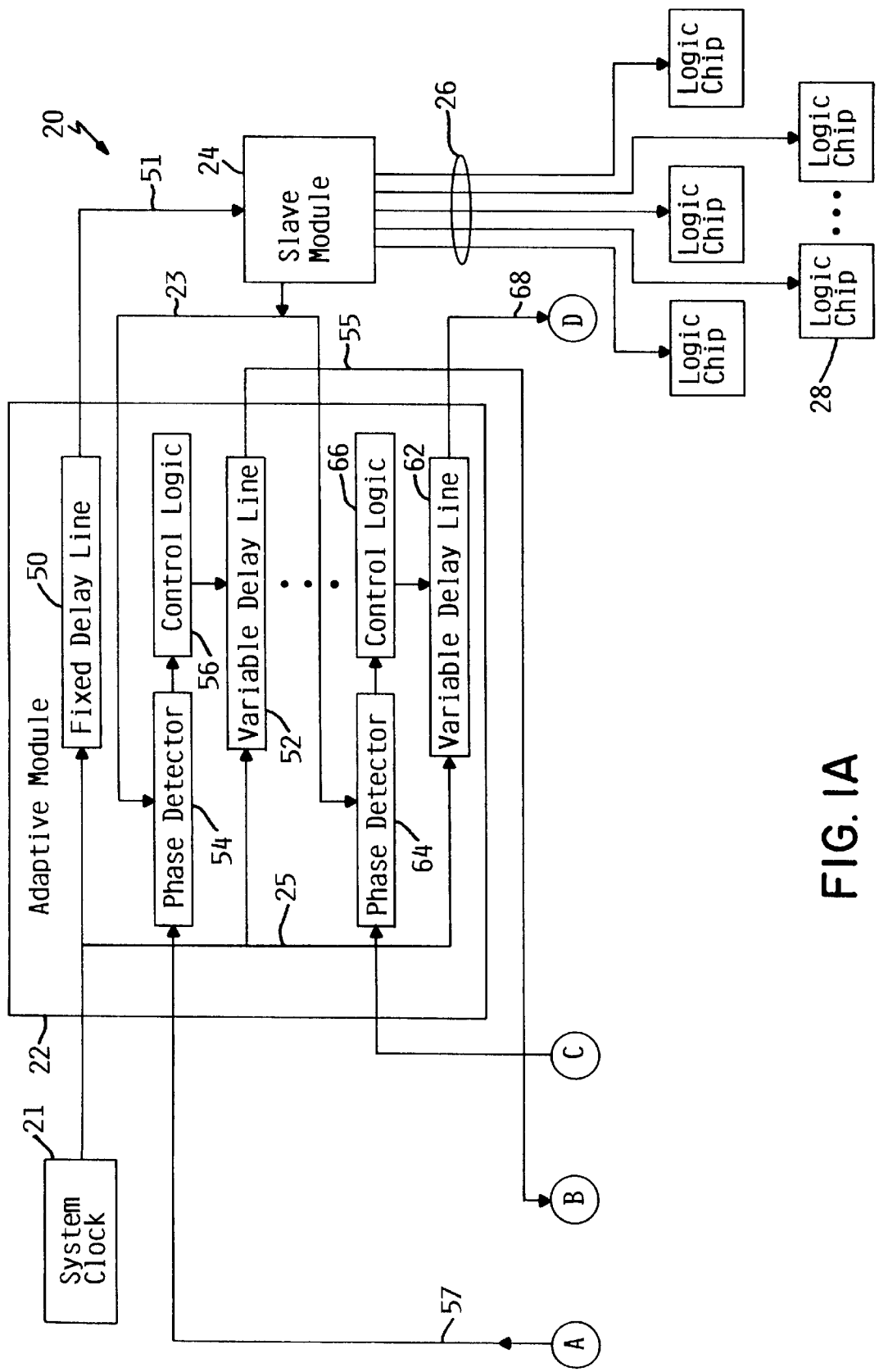
FIG. 1 is a block diagram of an adaptive clock signal distribution circuit according to an embodiment of the present invention.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF VARIOUS EMBODIMENTS

In the following description of the illustrated embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

In broad and general terms, a clock signal distribution approach according to the present invention provides for all clock paths of a multiple-chip and/or multiple-card digital system requiring low skew system clock signals to operate in phase with respect to a single reference clock path. Chip-to-chip and card-to-card skew is controlled with a high degree of effectiveness through employment of a clock signal distribution approach implemented in accordance with the principles of the present invention.

An embodiment of the present invention provides for the generation of a reference signal representative of a fixed delay of a system clock signal, and then setting variable delays to all other clock paths in the system to a desired phase relationship with respect to the reference clock path. Clock signal distribution circuitry implemented in accordance with another embodiment of the present invention provides for a dual mode of operation, by which system-wide clocking is accomplished in either a buffer-type clock repowering mode or an adaptive mode.

Figure 1B:
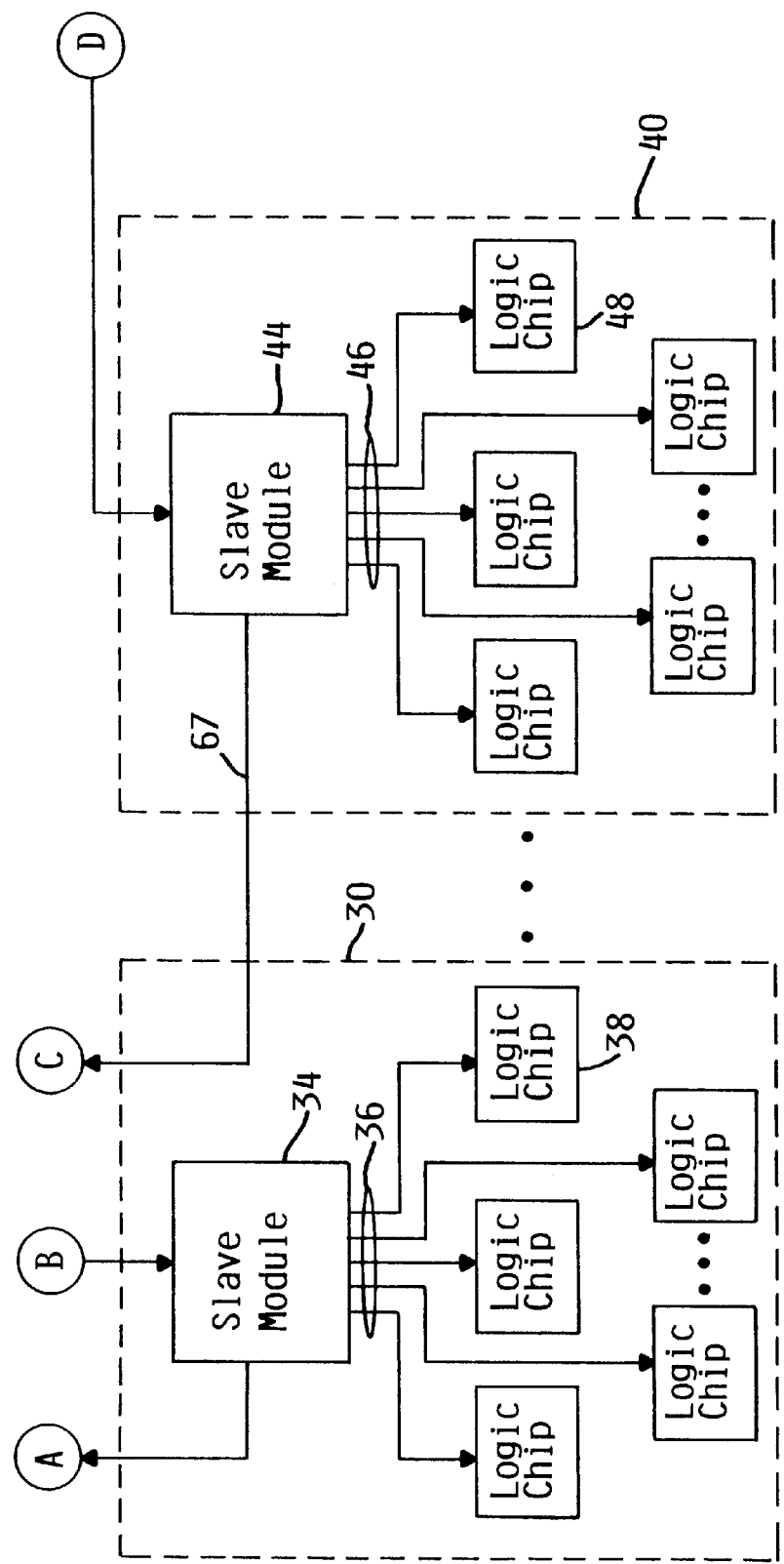

Referring to the drawings, and more particularly to FIG. 1, there is illustrated a block diagram of multiple-chip and/or multiple-card clock distribution circuitry 20 that employs adaptive skew compensation in accordance with an embodiment of the present invention. In accordance with this embodiment, clock distribution circuitry 20 includes an adaptive module 22 which receives a system clock signal from a system clock 21. System clock 21 is typically, but not necessarily, provided on the same card as adaptive module 22.

Adaptive module 22, which may be viewed as a master module, is coupled to a number of slave modules, including slave modules 24, 34, 44 via conductors 51, 55, 65, respectively. Slave modules 34 and 44 are preferably provided on separate cards 30 and 40, and are respectively coupled to a number of separate logic devices or chips 38, 48 populating respective cards 30, 40.

In this configuration, conductors 55 and 65 represent card-to-card conductors for communicating clocking signals from adaptive module 22 to cards 30 and 40. Conductors 36, 46 communicate clocking signals respectively from slave modules 34, 44 to logic chips 38, 48. It is understood that several separate slave modules equivalent in configuration and function to slave modules 34, 44 may be coupled to adaptive module 22, each of which is coupled to a respective number of logic chips.

Slave module 24, in accordance with one embodiment, is provided on the same card as adaptive module 22. Logic chips 28 are respectively coupled to slave module 24 via conductors 26, and may be provided on the same or different card as slave module 24. In accordance with another embodiment, slave module 24 is provide on a card separate from that of adaptive module 22, in which case conductors 51 represent card-to-card conductors. In this configuration, logic chips 28 preferably populate the separate card upon which slave module 24 is provided.

Adaptive module 22 includes a number of delay lines, including a fixed delay line 50 and several variable delay lines 52, 62. The number of variable delay lines 52, 62 vary according to the number of slave modules of the type depicted as slave modules 34 and 44. Each of the variable delay lines 52, 62 is controlled by a respective control logic device 56, 66. Control logic devices 56, 66 adjust the delay factor or delay duration of respective variable delay lines 52, 62 in response to an output signal produced by phase detectors 54, 64.

The system clock signal generated by system clock 21 is transmitted to fixed delay line 50 and each of the variable delay lines 52, 62. Slave module 24 is coupled to fixed delay line 50 and will be referred to hereinafter as a primary slave module. The slave modules which are coupled to variable delay lines of adaptive module 22, such as slave modules 34, 44 respectively coupled to variable delay lines 52, 62, will be referred to hereinafter as secondary slave modules.

In response to a system clock signal received by adaptive module 22, fixed delay line 50 produces a delayed clock signal of fixed or constant duration. This delayed clock signal is communicated from fixed delay line 50 to primary slave module 24 via conductor 51. Each of the variable delay lines 52, 62, in response to the system clock signal, produces a delayed clock signal, the duration of delay being varied in response to respective control signals received from control logic devices 56, 66. The clock signals processed by variable delay lines 52, 62 in a manner described hereinbelow are respectively transmitted to secondary slave modules 34, 44.

Primary slave module 24, in response to the delayed clock signal received from fixed delay line 50, produces a reference clock signal which is transmitted to logic chips 28. The reference clock signal produced by primary slave module 24 is fed back to adaptive module 22 and used as a clock signal reference by each of the secondary slave modules 34, 44. More particularly, the reference clock signal produced by primary slave module 24 is used as the clock signal for each of the phase detectors 54, 64.

The duration or delay factor provided by fixed delay line 50 is preferably greater than the minimum delay factor provided by variable delay lines 52, 62. The variable delay lines 52, 62 are initially set to a minimum delay factor. Fixed delay line 50 may be set, for example, to a delay factor of about half of the maximum design delay factor. As such, signals transmitted by secondary slave modules 34, 44 via conductors 57, 67 are received by phase detectors 54, 64 at a time prior to receipt of the reference clock signal produced by primary slave module 24. In other words, each of the variable delay lines 52, 62 must typically add delay in order for the signals processed therethrough to be in phase with the reference clock signal.

In response to a phase difference between the reference clock signal and feedback signals received from secondary slave modules 34, 44 via conductors 57, 67, phase detectors 54, 64 transmit respective output signals to control logic devices 56, 66. Control logic devices 56, 66 adjust the delay factor of respective variable delay lines 52, 62 until the feedback signals received from secondary slave modules 34, 44 are in phase with the reference clock signal. The variable delay lines 52, 62 then transmit respective phase-adjusted variable clock signals to secondary slave modules 34, 44 which, in turn, are communicated to logic devices 38, 48.

Referring now to FIGS. 2–5, there is provided several block diagrams and a timing diagram illustrating a particular embodiment of the present invention. In accordance with this embodiment of clock signal distribution circuitry 100, a system card 102 includes an oscillator card 108, an adaptive or master module 104, and a primary slave module 106. As was discussed previously, primary slave module 106 may alternatively be provided on a card separate from system card 102. It is noted that oscillator card 108 may be included on system card 102, on a card separate from system card 102, or integrated as part of the master module 104.

Figure 3A:
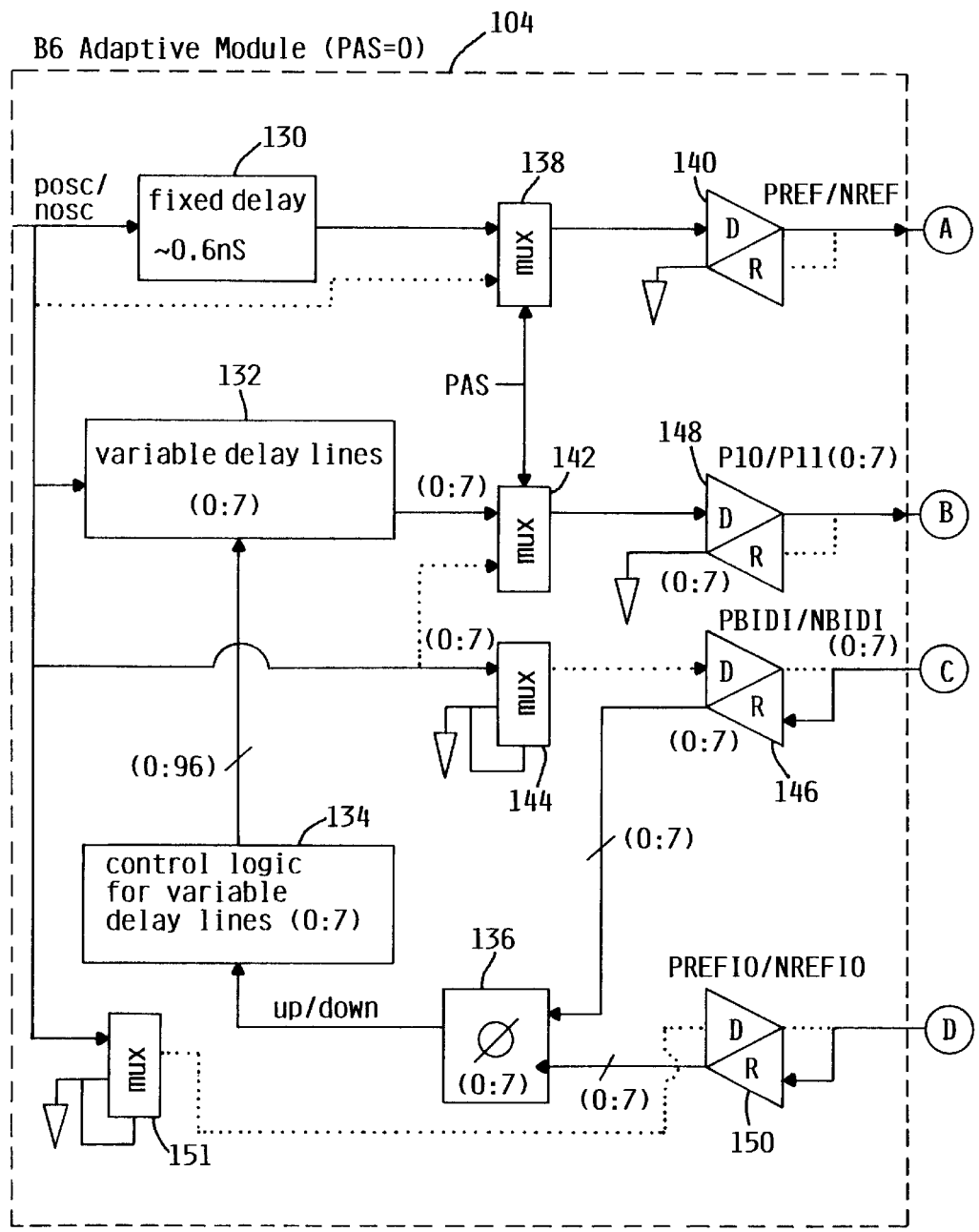
FIG. 3 is a block diagram of an adaptive master module coupled to a number of slave modules employed in an adaptive clock signal distribution circuit according to an embodiment of the present invention.
Figure 3B:
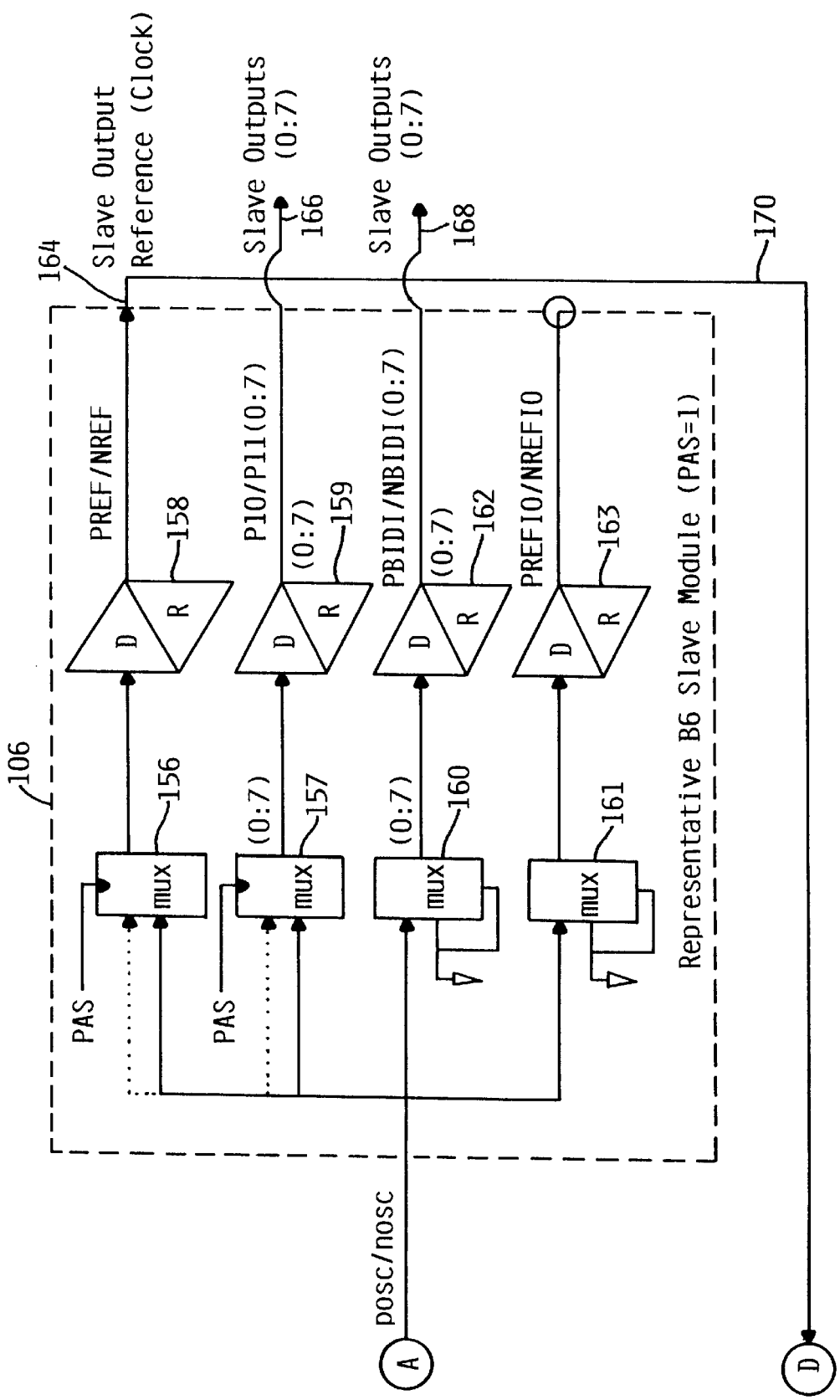
Figure 3C:
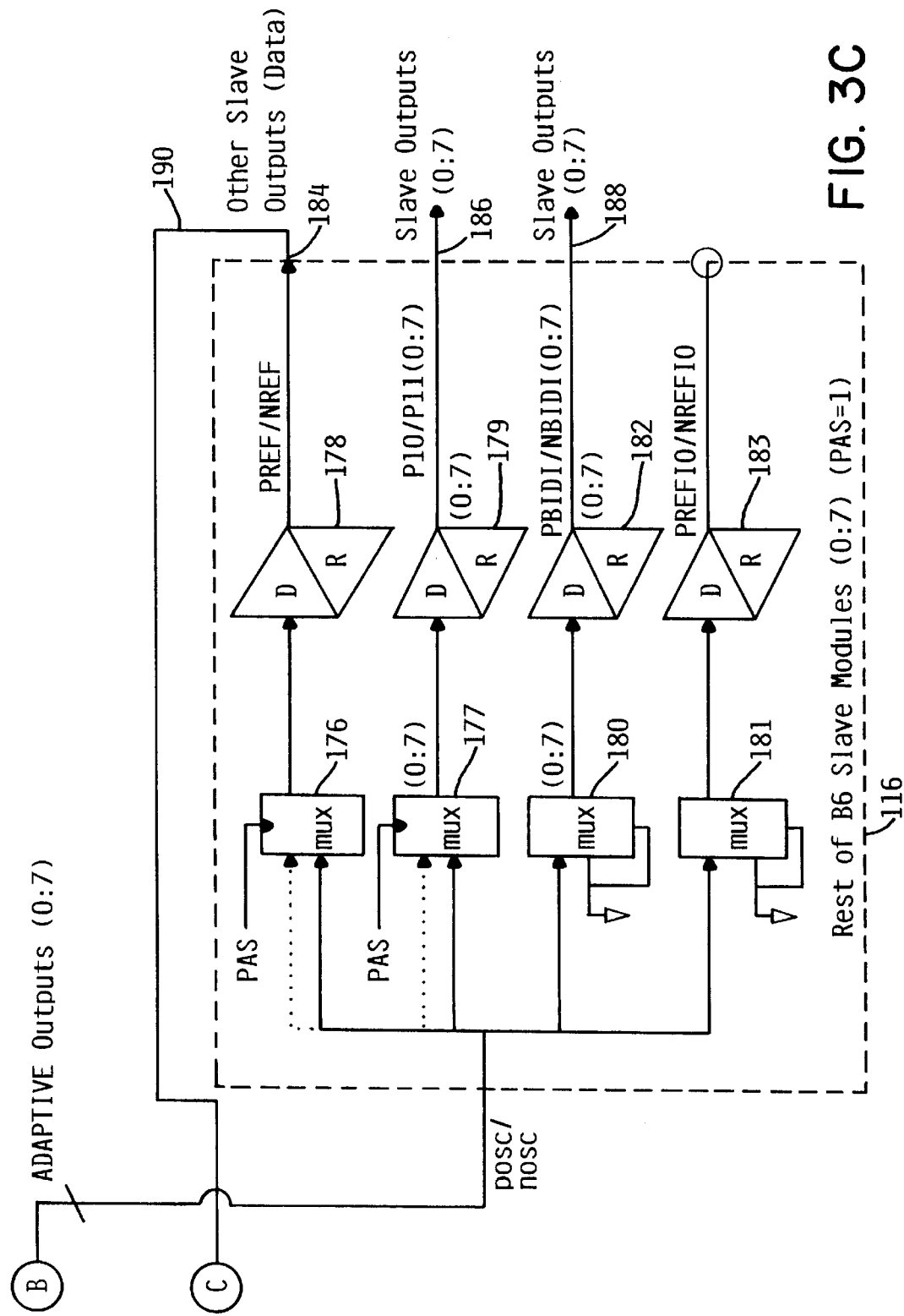
Figure 4A:
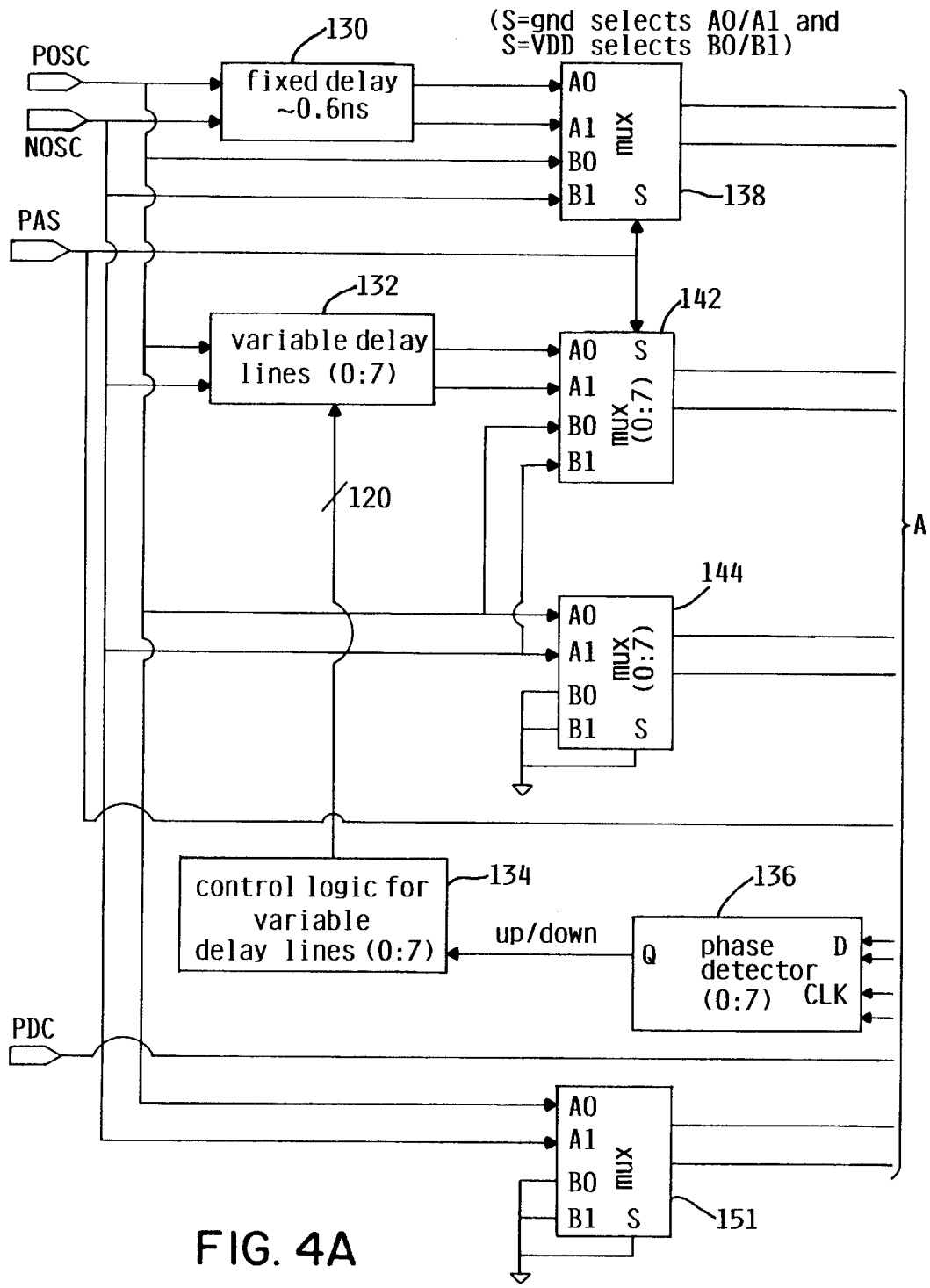
FIG. 4 is a block diagram of the adaptive master module of FIG. 3.
Figure 4B:
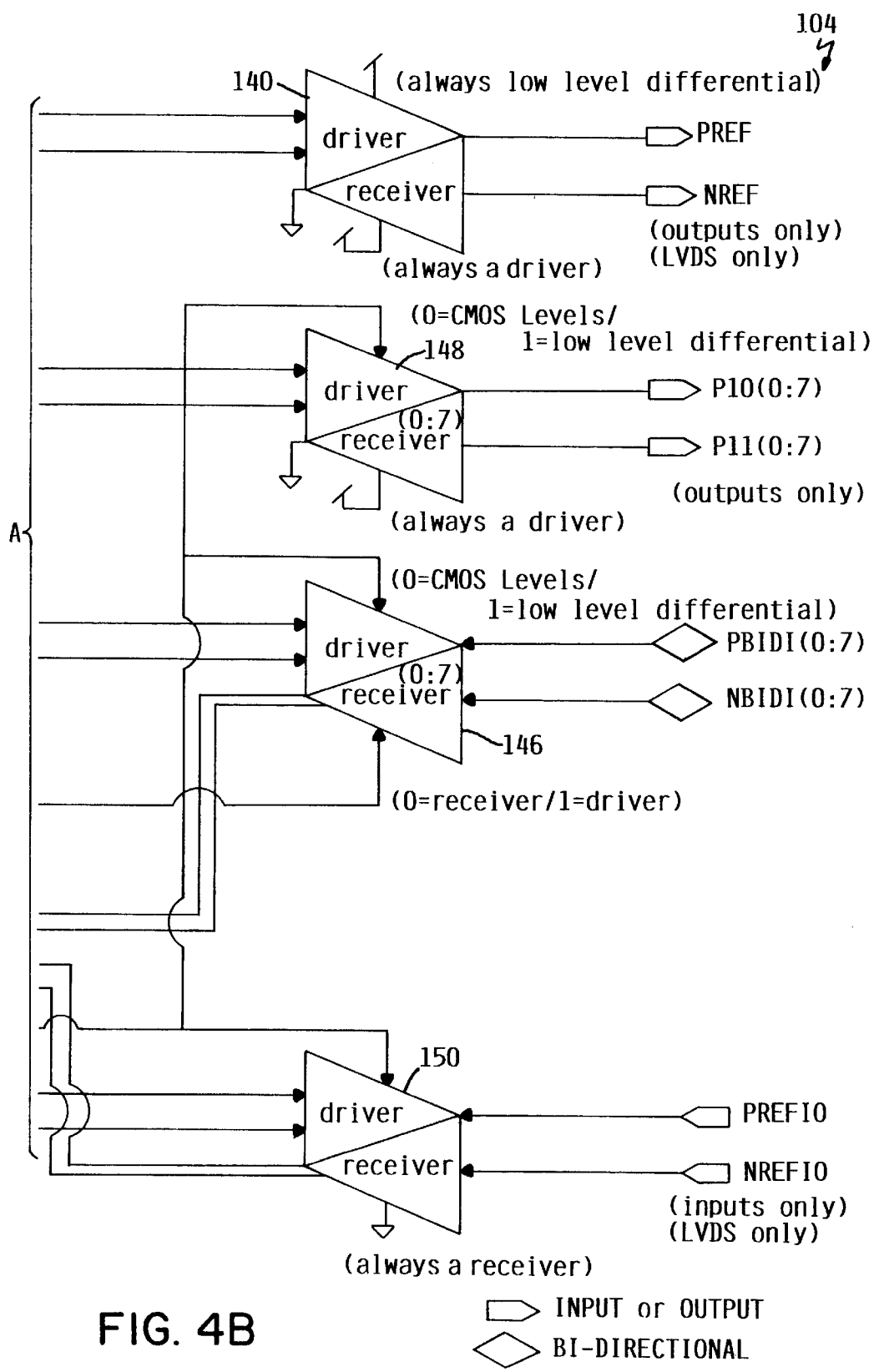
Figure 5:
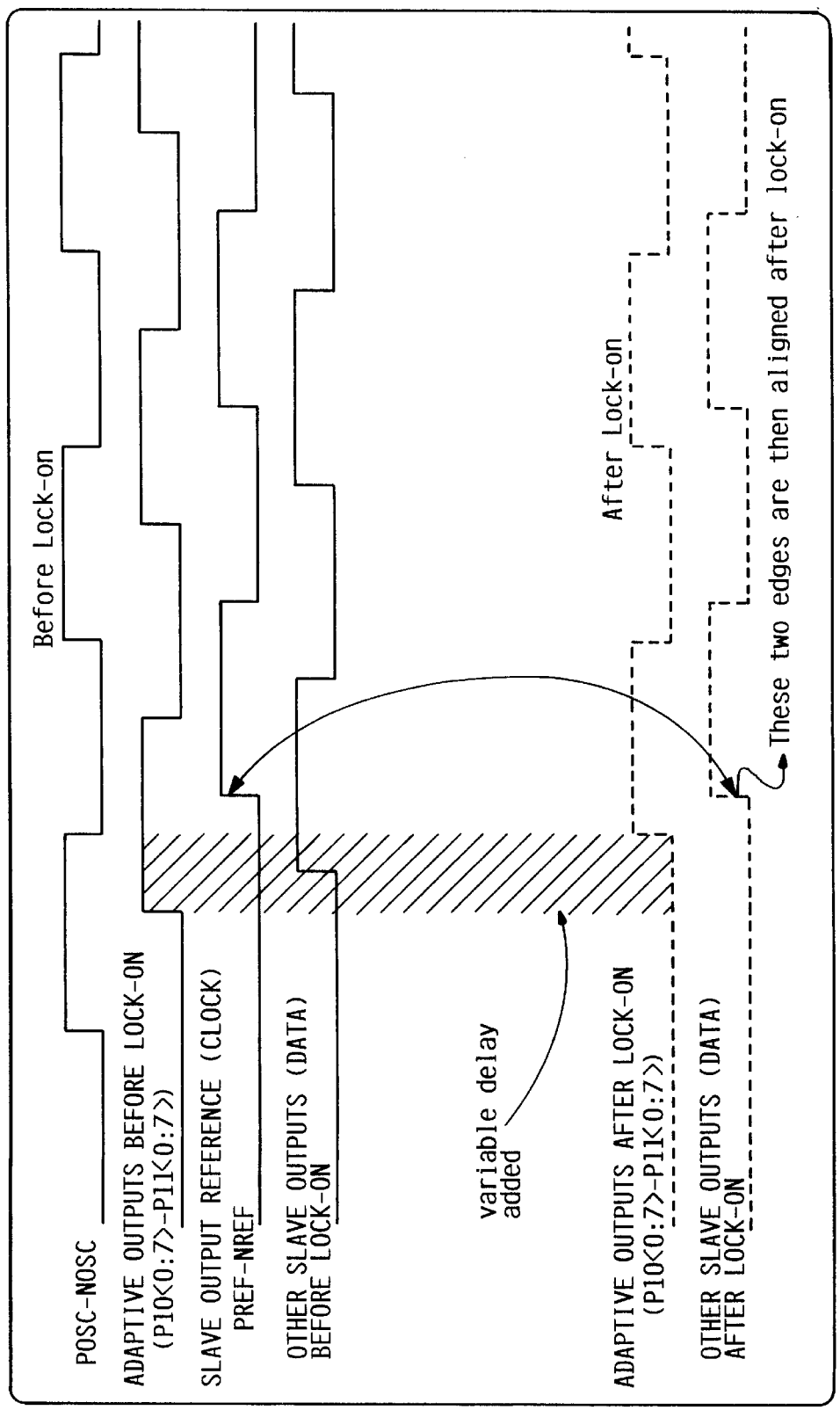
FIG. 5 is a timing diagram characterizing the operation of adaptive clock signal distribution circuitry according to an embodiment of the present invention.

Adaptive module 104 receives a system clock signal generated by an oscillator 110 and frequency synthesizer 112 provided on the oscillator card 108. The system clock signal, shown as differential signals $P_{osc}$ and $N_{osc}$ in FIGS. 3–5, is applied to fixed delay line 130, which, according to this embodiment, provides a fixed delay factor of approximately 0.6 nanoseconds (ns). Differential system clock signals, $P_{osc}$ and $N_{osc}$, represent low voltage differential signals (LVDS) in this embodiment. Differential system clock signals, $P_{osc}$ and $N_{osc}$, are also applied to variable delay lines 132.

In this embodiment, adaptive module 104 includes eight variable delay lines 132, indicated as variable delay lines (0:7) in FIGS. 3 and 4. The differential system clock signals, $P_{osc}$ and $N_{osc}$ delayed by fixed delay line 130 are communicated to primary slave module 106 through multiplexer 138 and receiver/driver 140. The differential system clock signals, $P_{osc}$ and $N_{osc}$, delayed by variable delay lines 132 are communicated to respective secondary slave modules, such as secondary slave module 116, through multiplexers 142 and receiver/drivers 148.

The differential system clock signals, $P_{osc}$ and $N_{osc}$, delayed by fixed delay line 130 are received by multiplexers 156, 157, 160, 161 of primary slave module 106 and transmitted through respective receiver/drivers 158, 159, 162, 163. The signals developed at an output 164 of primary slave module 106 represent differential reference clock signals, $P_{REF}$ and $N_{REF}$. The differential reference clock signals, $P_{REF}$ and $N_{REF}$, produced at output 164 of primary slave module 106 are transmitted to the phase detectors 136 associated with each of the variable delay lines 132 via conductors 170 and respective receiver/drivers 150.

The differential system clock signals, $P_{osc}$ and $N_{osc}$ received by primary slave module 106 are transmitted to multiplexer 157, which is representative of a number of like multiplexers, such as eight (0:7) multiplexers 157. The signals passed through receiver/drivers (0:7) 159 represent respective differential clock signals, $P_{10}/P_{11}(0:7)$, which are developed at outputs 166 of primary slave module 106. The differential clock signals, $P_{10}/P_{11}(0:7)$, are transmitted to a number of logic devices 114.

The differential system clock signals, $P_{osc}$ and $N_{osc}$, delayed by variable delay lines 132 are received by multiplexers 176, 177, 180, 181 of secondary slave module 116 and transmitted through respective receiver/drivers 178, 179, 182, 183. The signals developed at the output of receiver driver 178 represent differential signals, $P_{REF}$ and $N_{REF}$. The signals developed at an output 184 of secondary slave module 116 represent data output signals, $P_{BIDI}$ and $N_{BIDI}$. The data output signals, $P_{BIDI}$ and $N_{BIDI}$, produced at output 184 of secondary slave module 116 are transmitted to the phase detectors 136 associated with each of the variable delay lines 132 via conductors 190 and respective receiver/drivers 146.

The differential system clock signals, $P_{osc}$ and $N_{osc}$, received by secondary slave modules 116 are also transmitted to multiplexer 177, which is representative of a number of like multiplexers, such as eight (0:7) multiplexers 177. The differential signals passed through receiver/drivers (0:7) 179 represent differential clock signals, $P_1/P_{11}(0:7)$, which are developed at outputs 186 of each of the secondary slave modules 116. The differential clock signals, $P_{10}/P_{11}(0:7)$ produced by each secondary module 116 are transmitted to a number of logic devices 114 coupled thereto.

As was discussed previously, the differential reference clock signals, $P_{REF}$ and $N_{REF}$, produced at output 164 of primary slave module 106 are transmitted to the phase detectors 136 associated with each of the variable delay lines 132. Each of the phase detectors 136 may be implemented using a D latch circuit. The data output signals, $P_{BIDI}$ and $N_{BIDI}$, produced at output 184 of each secondary slave module 116 drive a data input to a respective phase detector 136. The differential reference clock signals, $P_{REF}$ and $N_{REF}$, produced at output 164 of primary slave module 106 drive another data input to the respective phase detector 136.

In response, each phase detector 136 transmits high or low logic signals to its respective control logic circuit 134 in order to increase or decrease the count of a binary counter provided in the control logic circuit 134. Adjusting the count of the binary counter results in a corresponding adjustment to the delay with respect to the variable delay line 134 coupled thereto.

It is to be understood that counters other than binary weighted counters may be employed to control a delay line implemented in accordance with the principles of the present invention. Gray scale counters, shift registers, and Johnson counters, for example, may be employed, along with appropriate decode logic, to provide appropriately weighted delays.

The control logic circuit 134 adjusts the delay of its respective variable delay line 134 until the data output signals, $P_{BIDI}$ and $N_{BIDI}$, of each of the secondary slave modules 116 are in phase with the differential reference clock signals, $P_{REF}$ and $N_{REF}$, produced by primary slave module 106. The timing diagram of FIG. 5 illustrates in-phase aligning of the respective leading edges of the data output signals, $P_{BIDI}$ and $N_{BIDI}$, and differential reference clock signals, $P_{REF}$ and $N_{REF}$, by implementing an adaptive clock signal distribution approach consistent with the principles of the present invention.

Another advantage realized through employment of an adaptive clock signal distribution approach according to the present invention concerns a multiple operating mode capability of the clock signal distribution circuitry depicted in the Figures. More particularly, the clock signal distribution circuitry shown in FIGS. 3–4 may be operated in a buffer-type clock repowering mode or the above-described adaptive mode. Employment of the various multiplexers and bi-directional receiver/driver circuits shown within the circuitry of adaptive module 104, primary slave module 106, and secondary slave module 116 provide for this dual mode of operation.

The operating mode of the clock signal distribution circuitry shown in FIGS. 3–4 is determined by the state of various control signals, such as the PAS and PDC control signals. Table 1 below describes a number of operating modes which may be selected in response to the state of the PAS and PDC control signals. The multiple mode capability of the clock signal distribution circuitry includes modes for operating on either CMOS level signals or low level differential signals (LVDS).

TABLE 1

| PAS | PDC | OPERATING MODE |
| --- | --- | --- |
| 0 | 0 | Adaptive Mode/CMOS Signal Levels |
| 0 | 1 | Adaptive Mode/LVDS Signal Levels |
| 1 | 0 | Buffer-Type Mode/CMOS Signal Levels |
| 1 | 1 | Buffer-Type Mode/LVDS Signal Levels |

Figure 2A:
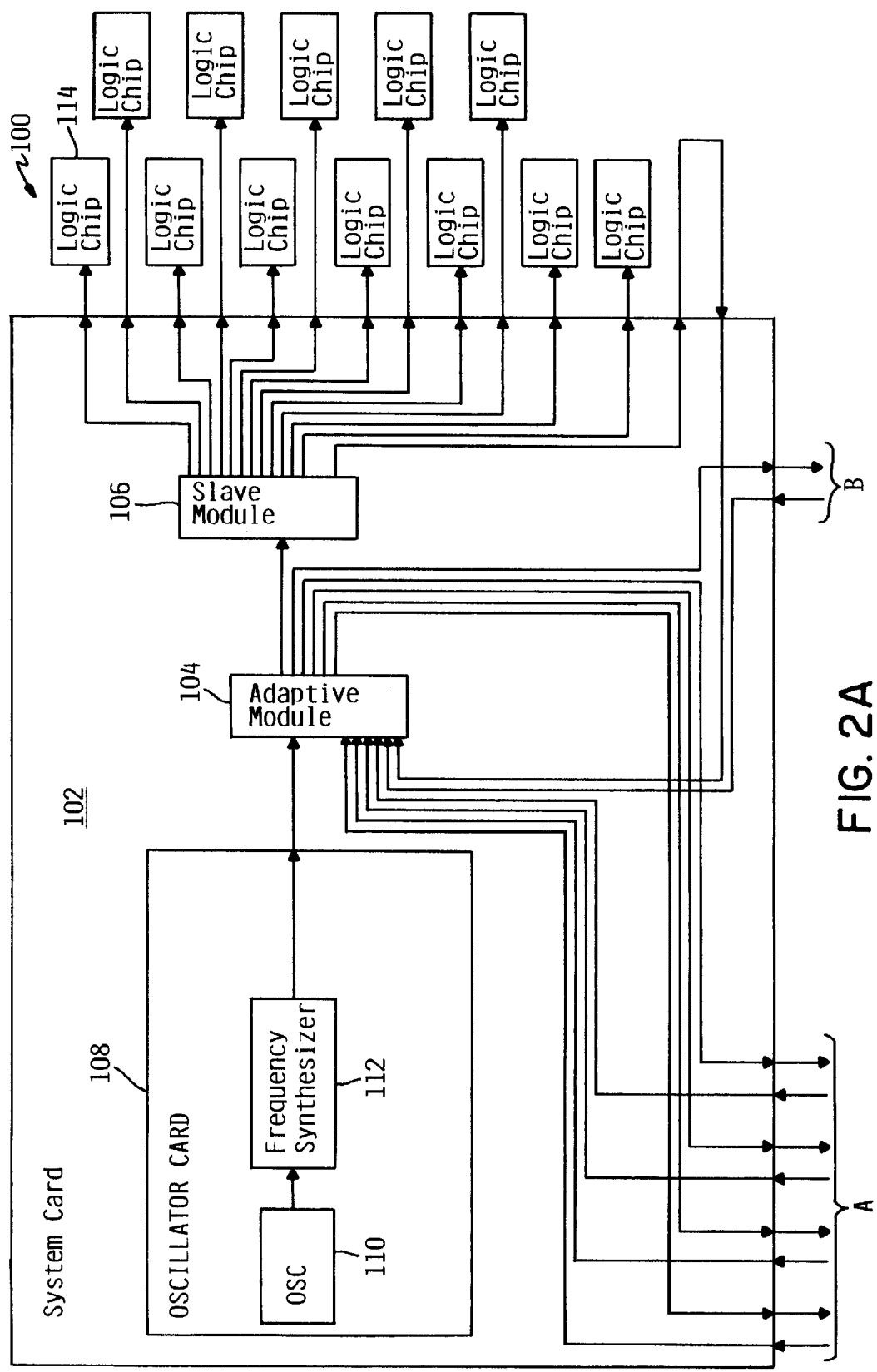
FIG. 2 is a block diagram of an adaptive clock signal distribution circuit according to another embodiment of the present invention.
Figure 2B:
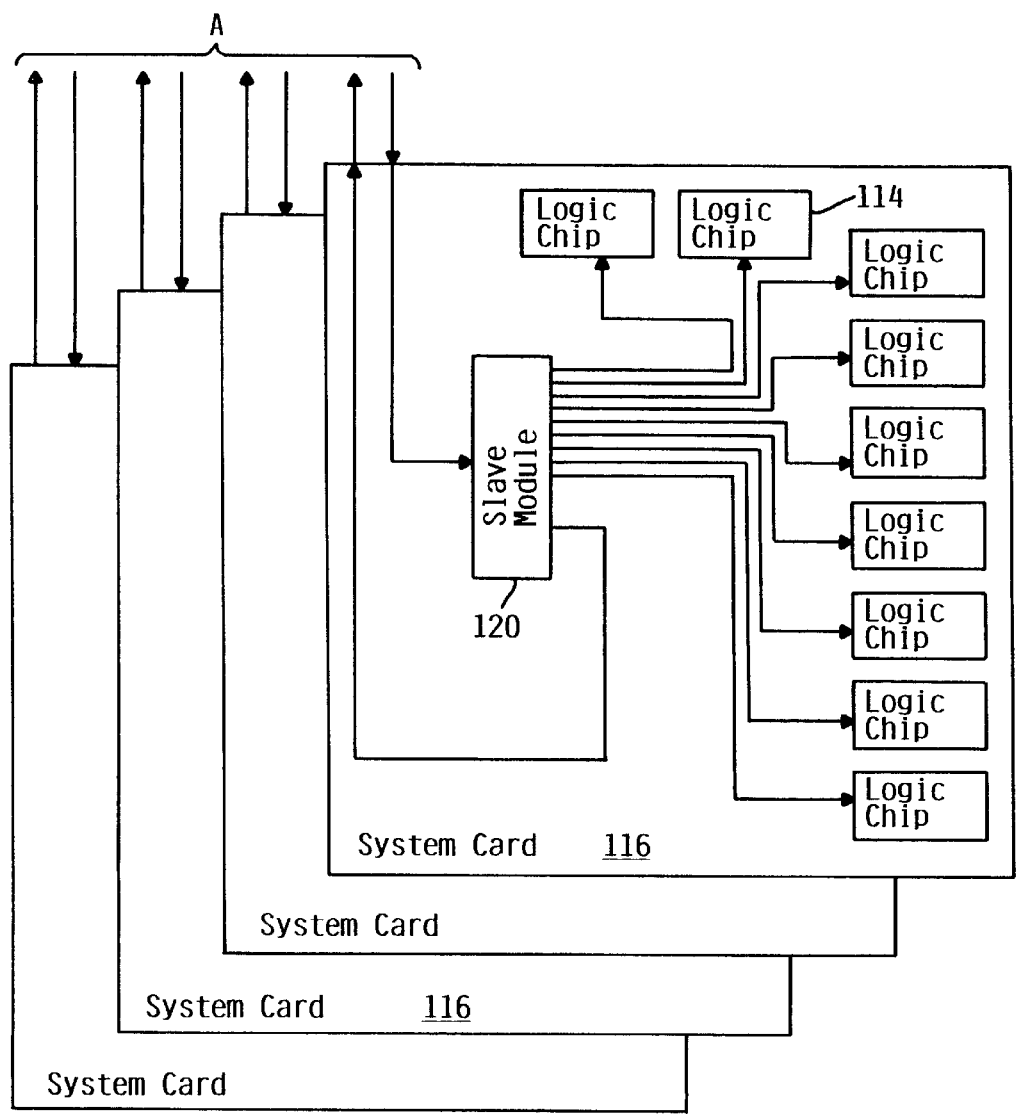
Figure 2C:
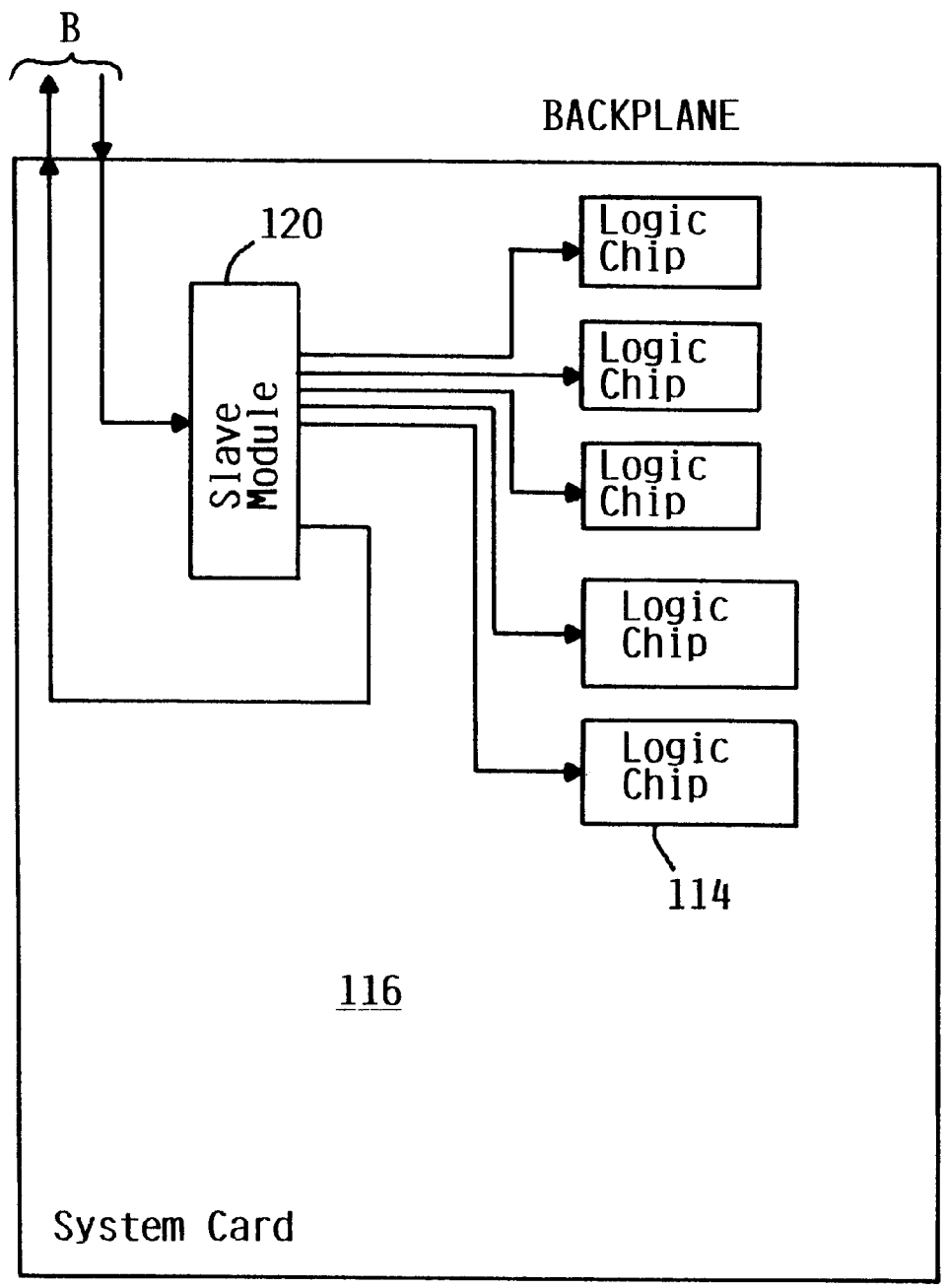

For purposes of illustration, and not of limitation, and as best understood with reference to FIG. 2, one adaptive module 104 may used to drive one primary slave module 106 and up to seven secondary slave modules 116 in an adaptive mode of operation. It is understood that the number of secondary slave modules 116 may be increased or decreased as needed for a particular implementation. For example, one adaptive module 104 may be readily coupled to between 14 and 20 secondary slave modules 116.

Each of the primary and secondary slave modules 106, 116 may drive up to seventeen logic chips. If there are 18 or fewer copies of the system clock signal to repower, the clock signal distribution circuitry 100 may be operated in a buffer-type repowering mode and in a manner known in the art. If there are more than 18 copies of the system clock signal to repower, the clock signal distribution circuitry 100 may be operated in a adaptive mode of operation as discussed previously.

Another aspect of the present invention concerns hold enabled or hold disabled modes of operation. In one embodiment, the clock signal distribution circuitry operates in an adaptive mode as previously described when the hold function is disabled. While in the adaptive mode, the clock signal distribution circuitry performs various operations to determine and compensate for skew throughout the system, such as by determining the delay factors of the variable delay lines as previously described.

After operating in the adaptive mode/hold disabled mode for a given period of time, it may be desirable to switch out of the adaptive mode to a hold mode of operation, during which the previously determined system skew parameters are used. For example, the hold mode may be initially disabled upon power-up, thereby permitting the clock signal distribution circuitry to operate in the adaptive mode. After a period of time, such as a duration of time required for system power to stabilize, the hold mode may be enabled so as to disable the adaptive mode of operation.

If, for example, the circuitry was subject to temperature variation, system-wide skew correction may be accomplished to compensate for such temperature variation by switching the hold mode ON, and thus the adaptive mode ON. The ability to switch between hold enable and hold disable modes of operation results in increased flexibility of the clock signal distribution circuitry of the present invention.

Another aspect of the present invention concerns adaptive and slave modes of operation. In one embodiment, and with reference to FIG. 3, the adaptive mode of operation is selected by setting control signal PAS to 0. A slave mode of operation is selected by setting PAS to 1. CMOS and LVDS signal levels may be selectively accommodated by appropriately setting control signal PDC to 0 or 1, as is indicated below in Table 2.

TABLE 2

| PAS | PDC | OPERATING MODE |
|-----|-----|----------------|
| 0 | 0 | Adaptive Mode/CMOS Signal Levels |
| 0 | 1 | Adaptive Mode/LVDS Signal Levels |
| 1 | 0 | Slave Mode/CMOS Signal Levels |
| 1 | 1 | Slave Mode/LVDS Signal Levels |

When the adaptive mode is selected, 9 of 18 (i.e., half) of the receiver/drivers of the adaptive module operate as drivers, while the balance of 9 receiver/drivers (i.e., other half) operate as receivers. In the slave mode of operation, all 18 receiver/drivers operate as drivers. As such, an additional 9 slave modules may be serviced using these additional 9 drivers when the clock distribution circuitry is operated in the slave mode, without the need to increase the number of pins provided on the adaptive module. For example, an output signal produced at slave output 188 of slave module 116 shown in FIG. 3 may be transmitted to the $P_{osc}/N_{osc}$ signal input of another slave module 116.

In accordance with another embodiment of the present invention, the variable delay lines shown in FIGS. 1–14 are of a type depicted in FIGS. 6–14. A variable delay line circuit according to this embodiment employs a reference voltage source that provides a voltage reference at a substantially constant amplitude with respect to the power supply in combination with delay element load/current scaling to provide for delay factors that do not vary significantly with power supply fluctuations. The small signal voltage amplitude or swing of the reference voltage provided to the variable delay line circuit is substantially constant, even in the presence of fluctuations in power supply voltage, thereby resulting in the production of delayed signals having substantially reduced skew and jitter.

Figure 6:
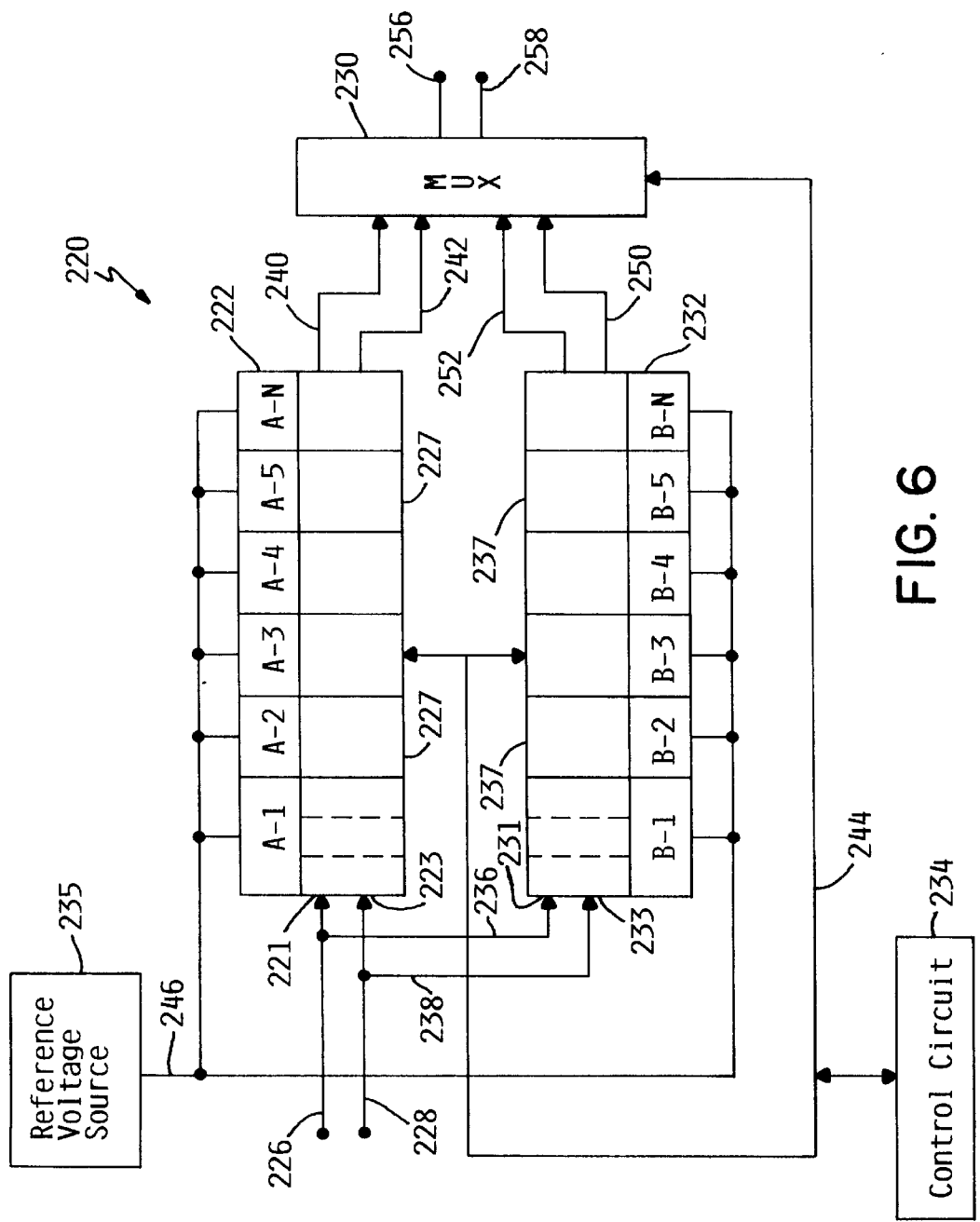
FIG. 6 is a block diagram of a variable delay line circuit employing a pair of delay lines in accordance with an embodiment of the present invention.

Referring now to FIG. 6, there is illustrated a variable differential delay line circuit 220 in accordance with an embodiment of the present invention. The delay line circuit 220, which is representative of variable delay line 132 shown in FIGS. 3–4 for example, includes two variable delay lines, 222 and 232, each having differential signal inputs 221, 223 and 231, 233, respectively. A differential input signal received from a system clock, such as system clock 21 shown in FIG. 1, is input to delay lines 222, 232 via conductors 226, 228 and 236, 238, respectively.

Delay lines 222, 232 further include respective differential outputs 240, 242 and 250, 252, each of which is coupled to a multiplexer 230. A control circuit 234 is coupled to each of the delay lines 222, 232 and multiplexer 230 via control lines 244. Control circuit 234 coordinates the operation of the delay line circuitry. A reference voltage source 235 provides a reference voltage having a substantially constant magnitude to each of the delay elements 227, 237 of delay lines 222, 232, the details and advantages of which will be described in greater detail hereinbelow. Individual delay elements 227, 237 may be selectively activated for use in delaying a differential input signal or, alternatively, may be bypassed.

The outputs 240, 242 and 250, 252 of respective delay lines 222, 232 are selectively coupled to the outputs 256, 258 of multiplexer 230 in response to control signals received from control circuit 234. In a preferred mode of operation, one of the first or second delay lines 222, 232 is selected for providing delay to a differential input signal applied to conductors 226, 228. The delayed differential signal produced by the selected delay line 222 or 232 is provided at differential outputs 256, 258 of multiplexer 230 and subsequently used by down-stream circuitry, such as slave module 34 shown in FIG. 1 for example.

During the time in which the selected first or second delay line 222 or 232 is used to operate on the differential input signal, the differential outputs of the unused delay line 222 or 232 are decoupled from differential outputs 256, 258 of the multiplexer. The delay factor, or duration of delay, provided by the unused delay line 222 or 232 is adjusted as desired during this time of non-use. A significant advantage realized by adjusting a delay line 222 or 223 during periods of non-use concerns isolating this delay line so that any signal discontinuities resulting from delay factor adjustment is prevented from reaching differential outputs 256, 258 of multiplexer 230.

After the delay factor of one of the two delay lines 222, 232 has been adjusted, control circuit 234 coordinates switching of the differential input signal from the previously in-use delay line 222 or 232 to the newly adjusted delay line 222 or 232. The delay factor of previously in-use delay line 222 or 232, now isolated from the differential outputs 256, 258 of multiplexer 230, may then be adjusted as desired. This process of selectively coupling a differential input signal applied to the delay line circuit 220 between delay lines 222 and 232 is repeated as necessary under the control of control circuit 234.

Each of the delay lines 222, 232 includes a number of delay elements 227, 237. Each delay element 227, 237 is controlled by control circuit 234 in order to vary the amount of delay provided by delay lines 222, 232. In a preferred embodiment, the delay elements are individually and selectively controlled to provide an incremental delay factor in predetermined step sizes, such as 128, 20 picosecond (ps) delay factor steps within a delay range of 20 ps to 1280 ps, for example. In this embodiment, delay lines 222, 232 constitute binary weighted differential delay lines.

As will be discussed later in greater detail, delay elements A-1 and B-1 have a unique structure which may, but not necessarily, be different from that of the other delay elements of delay lines 222, 232, such as delay elements A-2, A-5, B-3, and B-N, for example. More particularly, delay elements A-1 and B-1 of delay lines 222 and 232 may each be controlled to provide for several different delay factors.

Figure 7A:
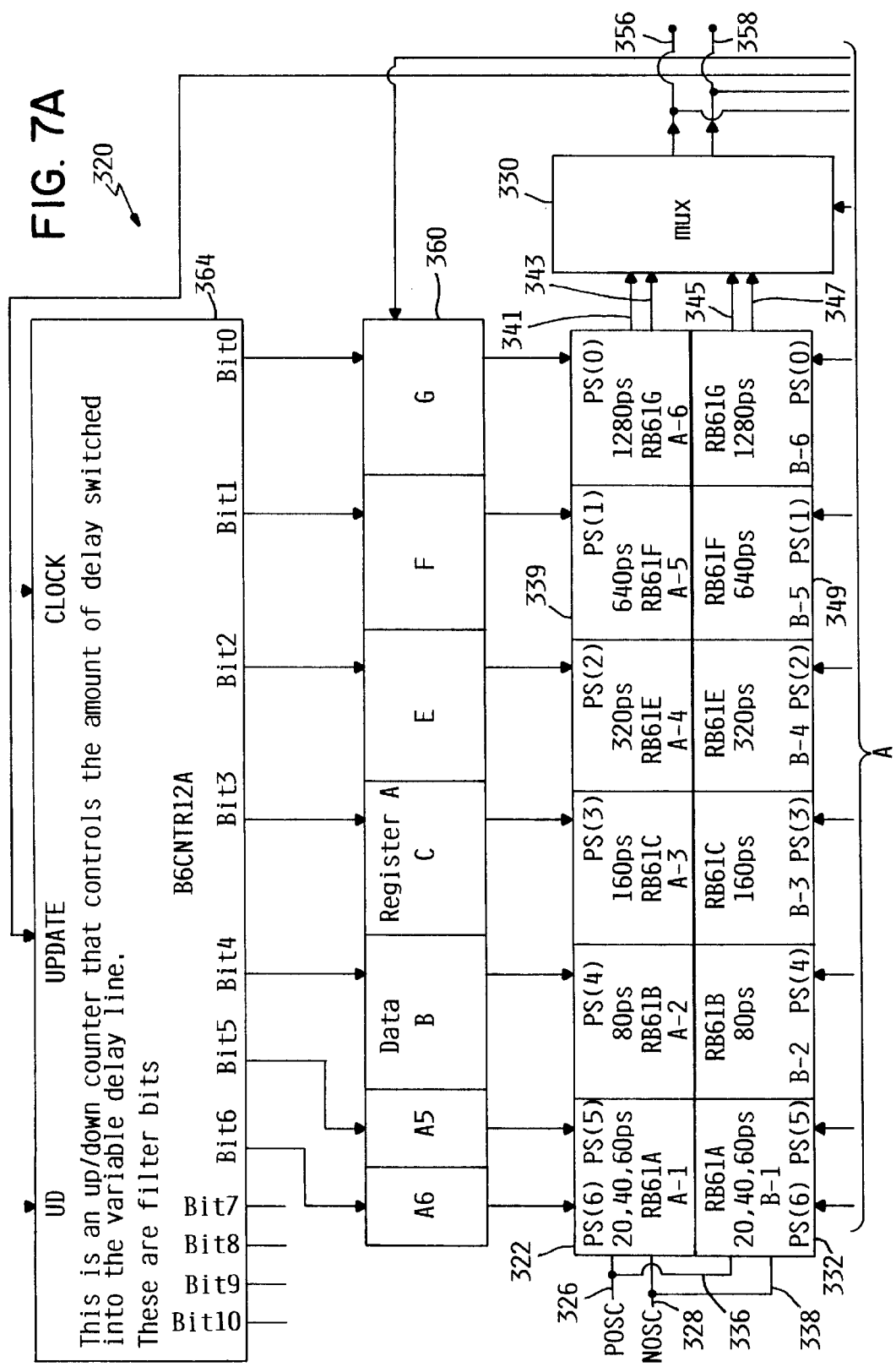
FIG. 7 is a block diagram of a digitally controlled variable delay line circuit employing a pair of binary weighted differential delay lines and digital control logic in accordance with an embodiment of the present invention.
Figure 7B:
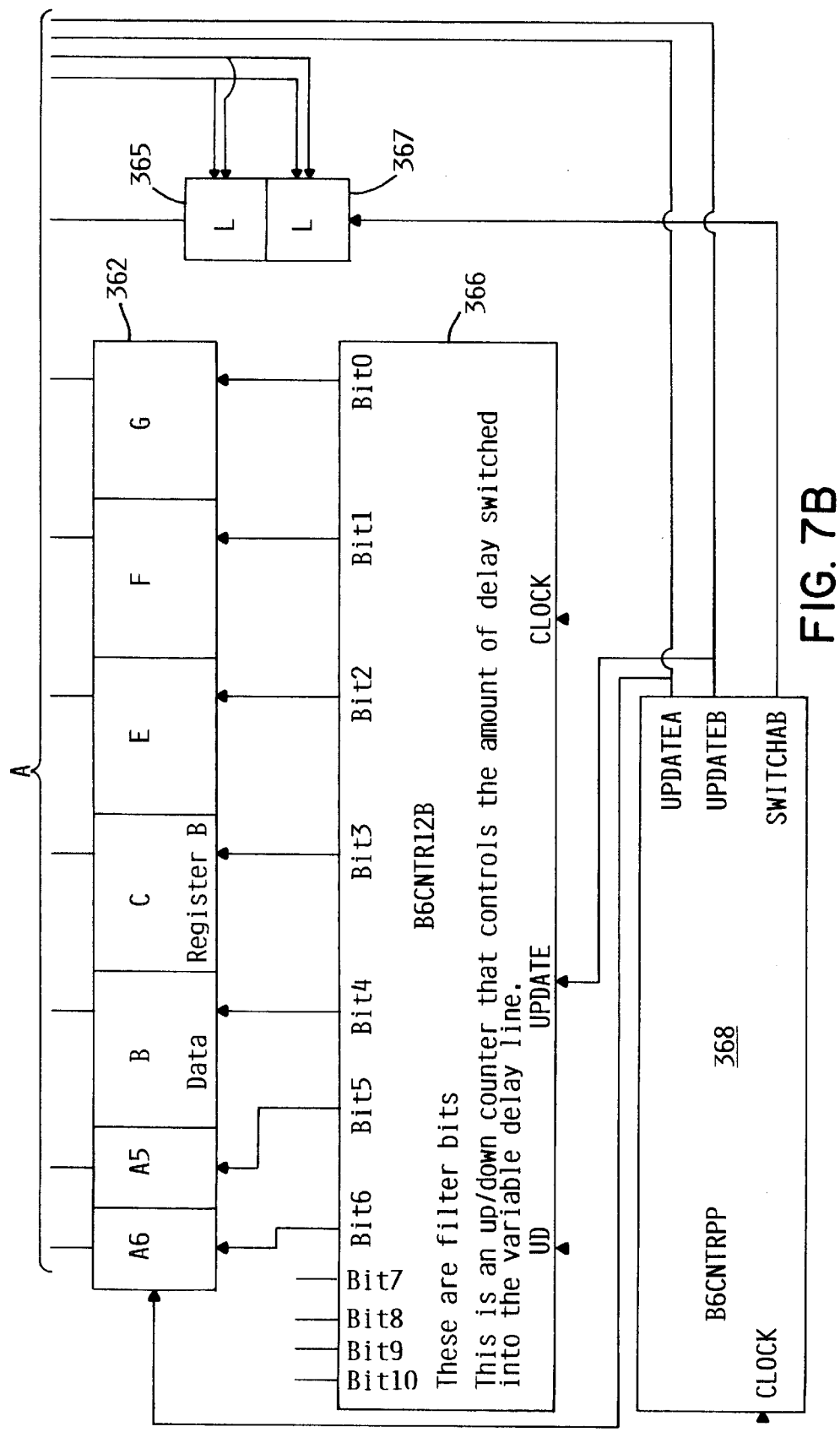
Figure 8:
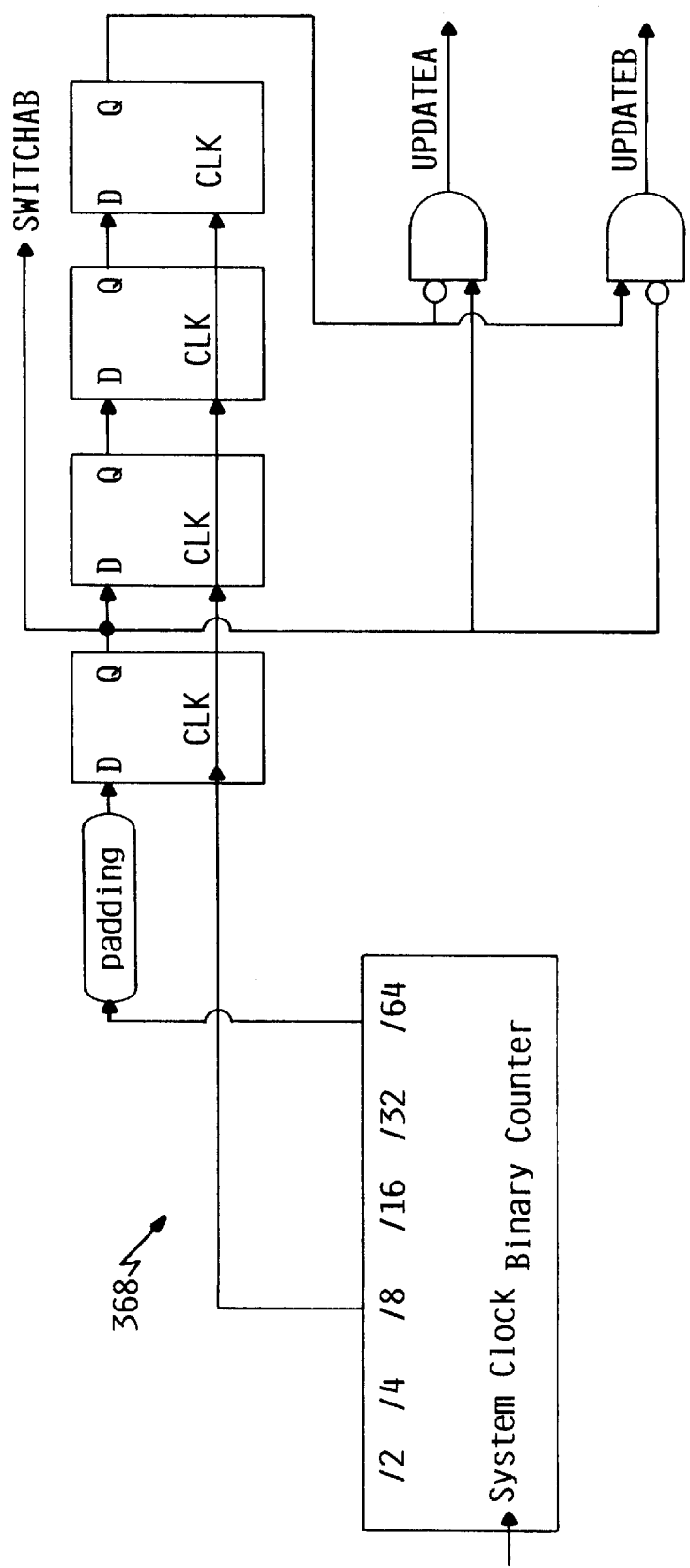
FIG. 8 is a block diagram of the control counter of FIG. 7.
Figure 9:
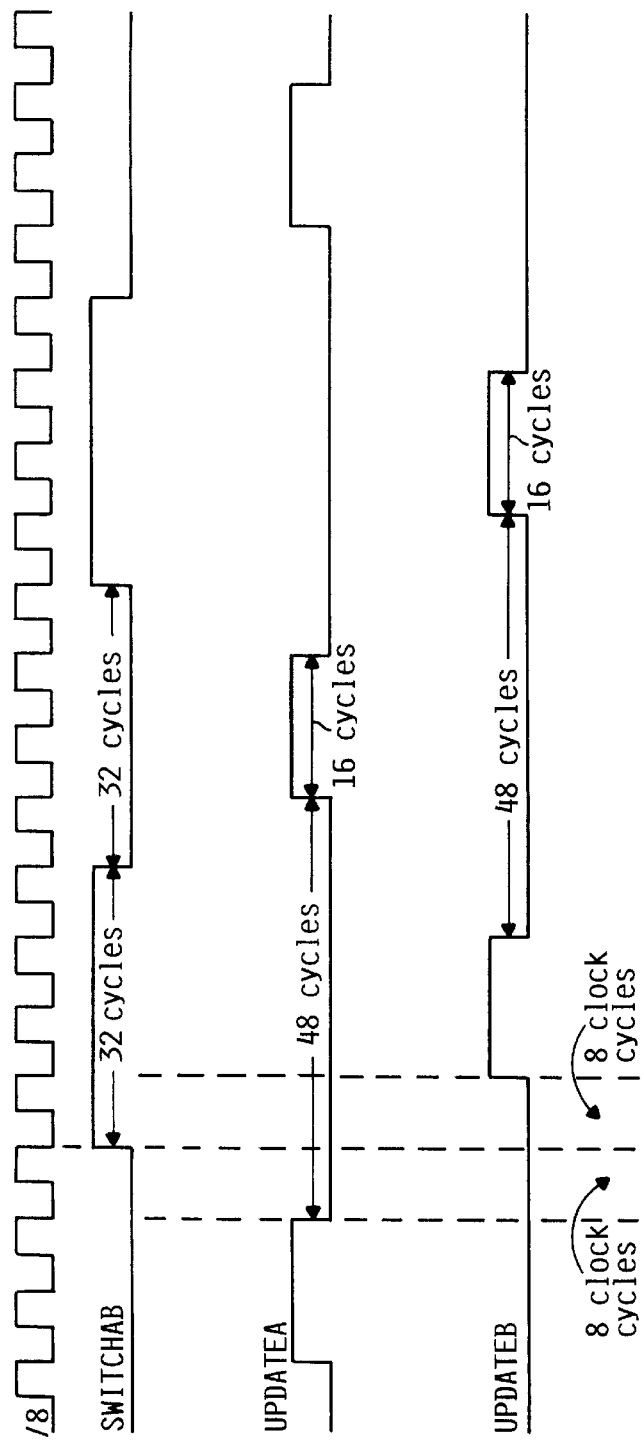
FIG. 9 is a timing diagram associated with the operation of the control counter of FIG. 8.

Turning now to FIG. 7, there is illustrated a digitally controlled differential delay line circuit 320 in accordance with another embodiment of the present invention. In accordance with this embodiment, the differential delay line circuit 320 includes two variable delay lines, 322 and 332, each having respective differential signal inputs 326, 328 and 336, 338 for receiving a differential input signal, such as differential signals $P_{osc}$ and $N_{osc}$ shown in FIGS. 3–5, and respective differential outputs 341, 343 and 345, 347 coupled to a multiplexer 330. An up/down counter 364 is coupled to delay line 322 through buffer circuit 360. An up/down counter 366 is coupled to delay line 332 through buffer circuit 362. Counters 364, 366 control the amount of delay switched into respective delay lines 322, 332.

Counters 364, 366 are respectively coupled to a counter controller 368 which coordinates the operation of counters 364, 366 and, therefore, delay lines 322, 332. In one embodiment, counter controller 368 is implemented as a ping-pong counter which receives a clocking signal from a system clock coupled thereto. A depiction of counter controller 368 and a timing diagram characterizing the operation of counter controller 368 according to this embodiment are provided in FIGS. 8 and 9, respectively. Up/down counters 364, 366, buffer circuits 360, 362 and counter controller 368 may be incorporated as part of control logic circuit 134 shown in FIGS. 3 and 4.

The outputs 341, 343 and 345, 347 of respective delay lines 322, 332 are selectively coupled to the outputs 356, 358 of the multiplexer 330 in response to signals received from counter controller 368 and signals fed back from outputs 356, 358 of the multiplexer 330 via latches 365, 367. A differential input signal applied to the delay line circuit 320 is selectively coupled between delay lines 322 and 332 in the general manner described previously with respect to FIG. 6. Adjustment to the delay factors of selected delay elements in the unused or inactive delay line 322 or 332 is accomplished in the general manner described previously with respect to FIG. 6.

Figure 10:
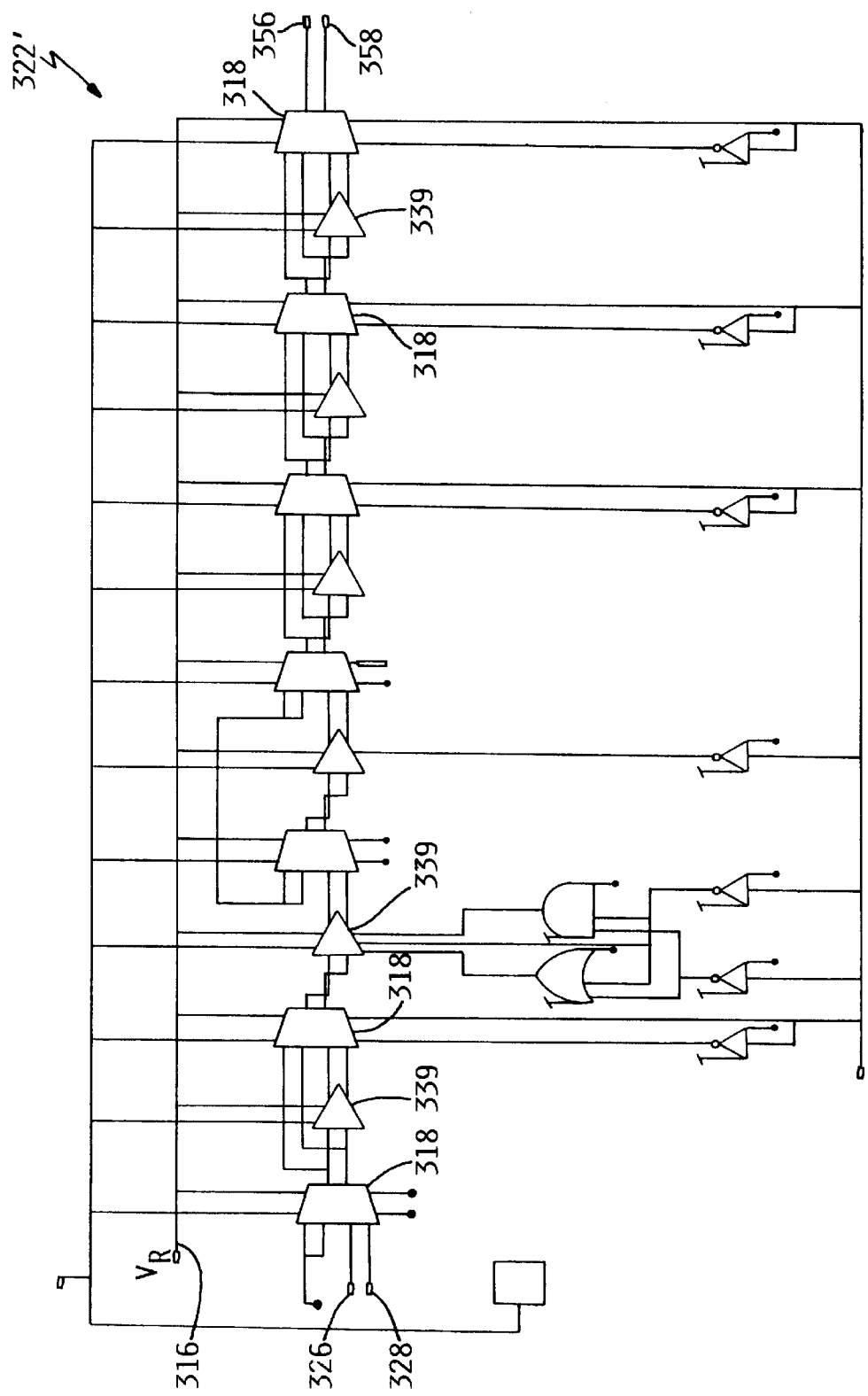
FIG. 10 is a schematic of a single delay line showing individual delay elements and multiplexers in accordance with an embodiment of the present invention.

Delay line circuit 322' depicted in the schematic of FIG. 10 illustrates one embodiment of delay line 322 shown in FIG. 7 in which a multiplexer 318 is coupled between adjacent delay elements 339. A multiplexer 318 is also coupled to differential signal inputs 326, 328 and to differential signal outputs 356, 358 of delay line 322'. Individual delay elements 339 of delay line 322' may be selectively activated for use in delaying a differential input signal or, alternatively, bypassed by appropriately controlling multiplexers 318.

Figure 11:
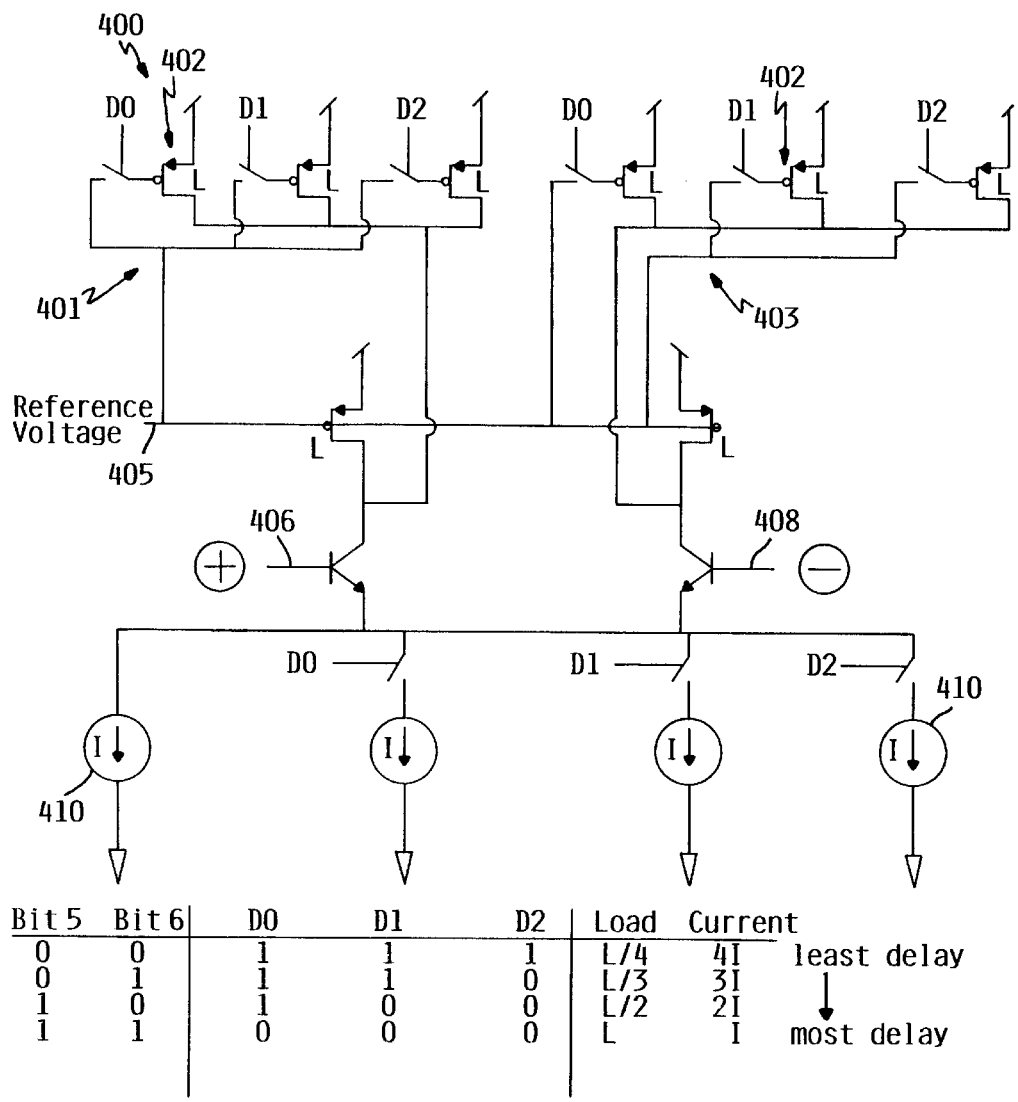
FIG. 11 is a simplified schematic of a delay element which provides four different delay factors in accordance with an embodiment of the present invention.

FIG. 11 is a simplified schematic depiction of delay line element A-1 shown in FIGS. 6 and 7. A more detailed schematic of the embodiment depicted in FIG. 11 is provided in FIG. 12. It is noted that delay line element B-1 has a structure equivalent to that of delay line element A-1. As was discussed previously, delay line elements A-1 and B-1 have unique structures, in that these elements may be controlled to provide a multiplicity of delay factors, such as four different delay factors for example. Other delay elements, such as delay elements A-2, A-4, B-3, and B-5 shown in FIGS. 6 and 7, have a structure similar to that shown in the schematic of FIG. 13. These delay elements may be controlled to provide two different delay factors. It can be seen that the number of different delay factors provided by a delay line element may be varied by varying the number of resistive load elements, as is discussed hereinbelow.

In general, variations in the power supply voltage provided to a delay line often result in unintended variations in the delay of the signal propagated through the delay line. It can be appreciated that the duration of the minimum delay factor of a delay line element has an appreciable affect on the magnitude of unintended changes to input signal delay resulting from fluctuations in power supply voltage. The magnitude of unintended delay changes occurring in a delay line element resulting from power supply voltage fluctuation is a function of the percentage of such unintended delay changes relative to the total delay provided by the delay line element. In many applications, it is therefore desirable to keep the total delay of a delay line element as small as possible so that unintended changes in signal delay due to power supply voltage fluctuation is minimized.

Delay elements A-1 and B-1 of delay lines 222, 232 of FIG. 6 or 322, 332 of FIG. 7 provide for a multiplicity of delay factors through controlled activation and deactivation of different combinations of loads and current sources. These loads are different for each different delay factor. Current may be scaled up or down so as to maintain the voltage drop across each load at a constant amplitude.

Figure 12:
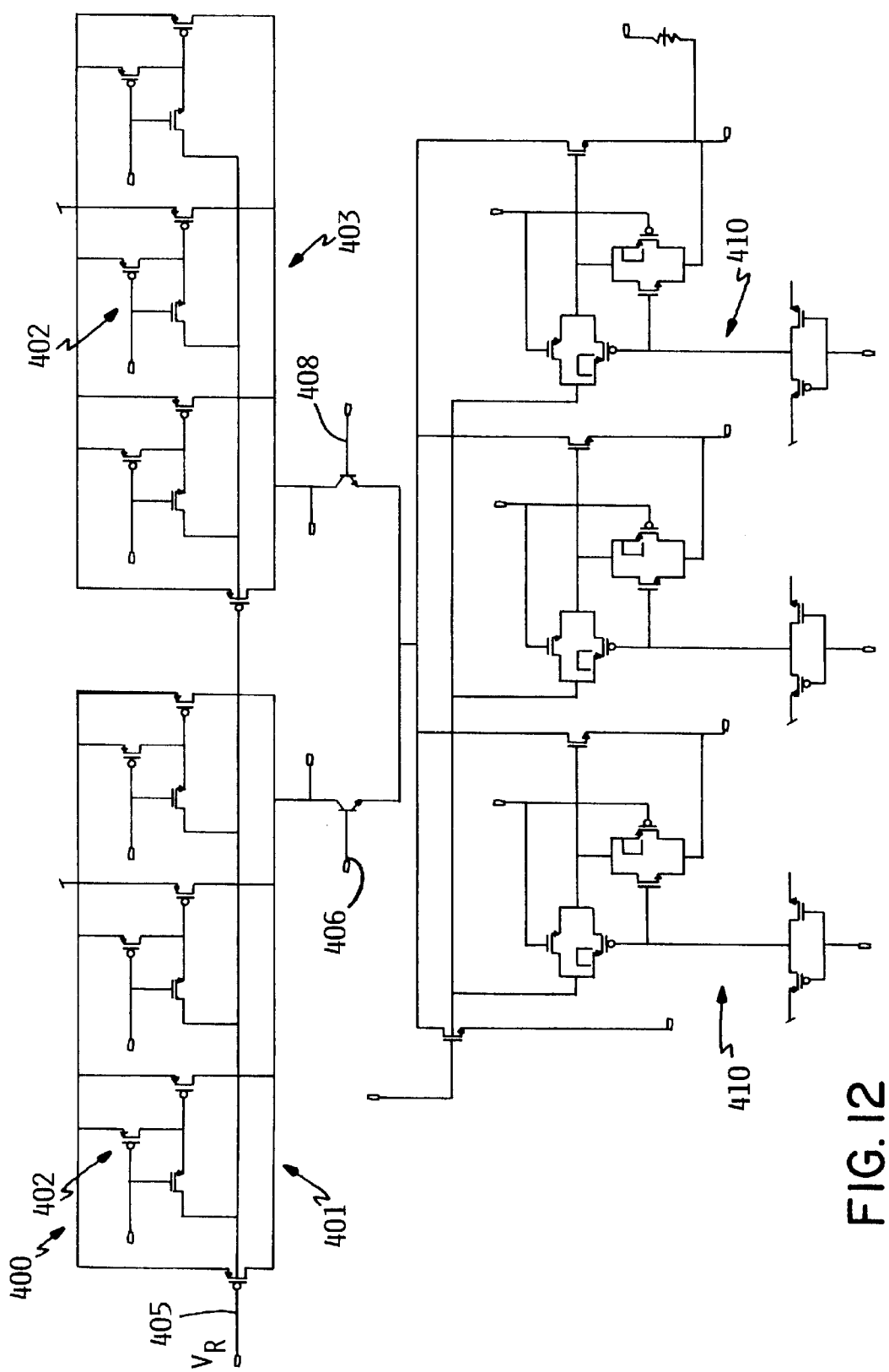
FIG. 12 is a detailed schematic of the circuit of FIG. 11.

With reference to differential delay element circuit 400 shown in FIG. 11, differential delay elements 401, 403 each include a number of resistive elements 402. The resistive elements 402, in accordance with one embodiment, are implemented using P-channel field effect transistors (P-FETS), as is best seen in FIG. 12. It is understood that resistive elements 402, as well as other elements of circuit 400, may be implemented in a technology best suited for a given application.

Each of the resistive elements 402 represents a unit load or unit resistance, L, and each of the current sources 410 represents a unit current, I. The gate of each P-FET resistive element 402 of differential delay elements 401 and 403 is respectively coupled to a reference voltage source which provides a voltage reference 405 of a substantially constant amplitude with respect to the power supply, such as 450 mV for example. Differential input signals, such as differential signals $P_{osc}$ and $N_{osc}$ shown in FIGS. 3–5, are applied to the differential delay element circuit 400 via positive and negative signal inputs 406 and 408, respectively.

A truth table is shown in FIG. 11 which represents the output of the binary counters that control the value of the delay in the delay lines, such as up/down counters 364 and 366 respectively coupled to, and controlling the delay of, variable delay lines 322 and 332 shown in FIG. 7. As is shown in the truth table, the delay factor or duration of delay provided by differential delay elements 401 and 403 may be varied by adjusting the resistance, L, and current, I, in response to digital output signals received from the respective binary counters.

By way of example, when the binary counter output signals, represented by Bits 5 and 6 in FIG. 11, are both 0, the states of nodes D0, D1, and D2 are each 1. In this case, the equivalent resistive loading provided by differential delay element circuit 400 is given by L/4, and the current is given by 4I, which provides for a minimum delay factor. When Bits 5 and 6 are 0 and 1, respectively, the states of nodes D0, D1, and D2 are 1, 1, and 0, respectively. In this case, the equivalent resistive loading provided by differential delay element circuit 400 is given by L/3, and the current is given by 3I.

When Bits 5 and 6 are 1 and 0, respectively, the states of nodes D0, D1, and D2 are 1, 0, and 0, respectively. In this case, the equivalent resistive loading provided by differential delay element circuit 400 is given by L/2, and the current is given by 4I. Finally, when Bits 5 and 6 are both 1, the states of nodes D0, D1, and D2 are each 0. In this case, the equivalent resistive loading provided by differential delay element circuit 400 is given by L, and the current is given by I, which provides for a maximum delay factor.

The differential delay element circuit 400 effectively exploits load and current scaling to vary the delay factor provided by the delay element circuit. Moreover, differential delay element circuit 400 provides for a reduced total delay factor associated with each delay element load, thereby providing a delay factor that is substantially insensitive to variations in power supply voltage and temperature conditions.

Figure 13:
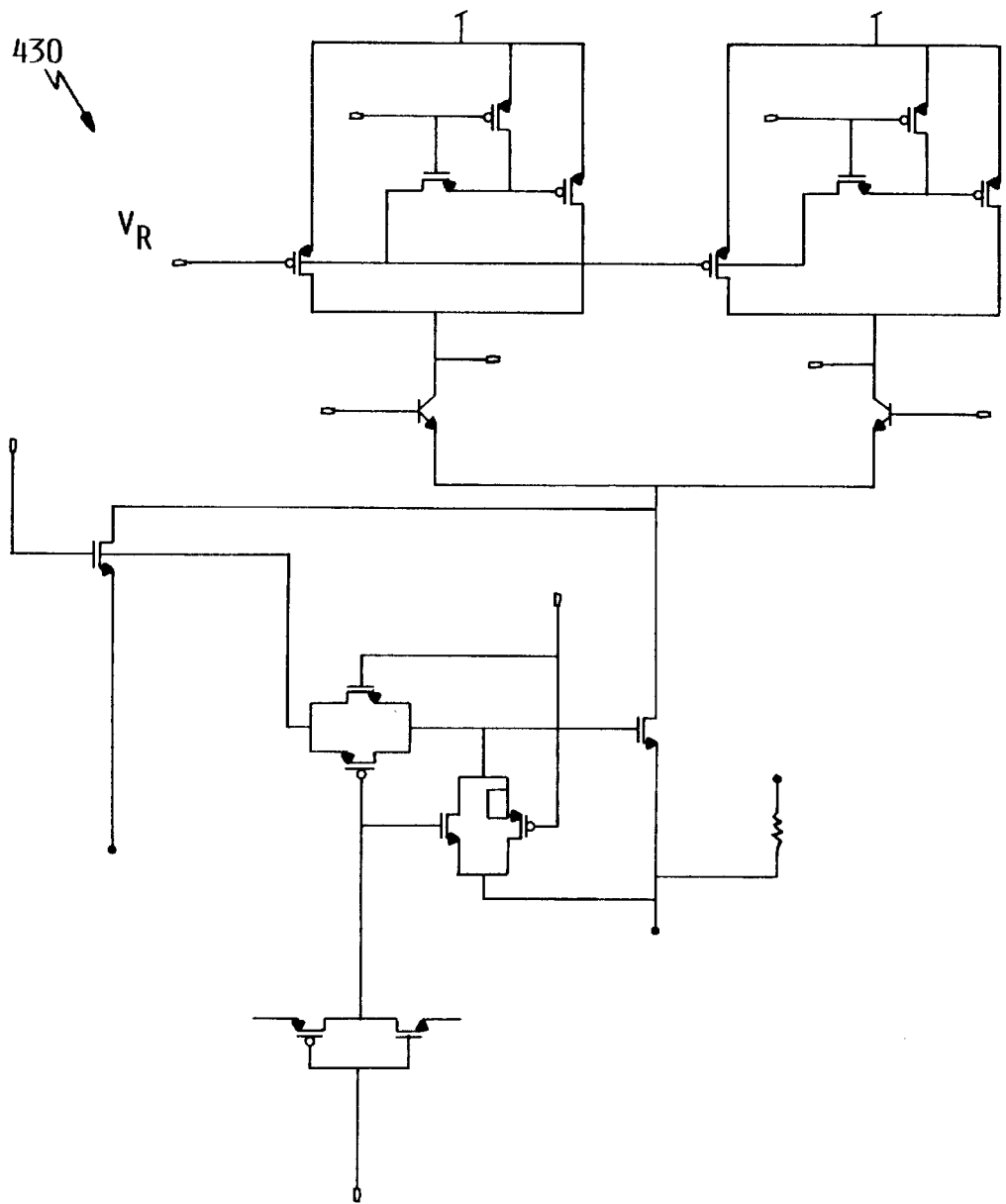
FIG. 13 is a schematic of a delay element which provides two different delay factors in accordance with an embodiment of the present invention.

The differential delay element circuit 430 shown in FIG. 13 operates in a manner substantially similar to that previously described with respect to FIGS. 11 and 12, but provides for only two different delay factors depending on the state of node D0.

As was previously discussed, variations in the supply voltage provided to a delay line often results in unintended variations in the delay of the signal propagated through the delay line. Providing a voltage reference at a constant amplitude with respect to the power supply to each of the delay elements of a delay line, in addition to minimizing the total delay factor of a number of delay devices provided in a delay element as previously discussed, can render the delay line substantially insensitive to power supply voltage fluctuations.

Figure 14:
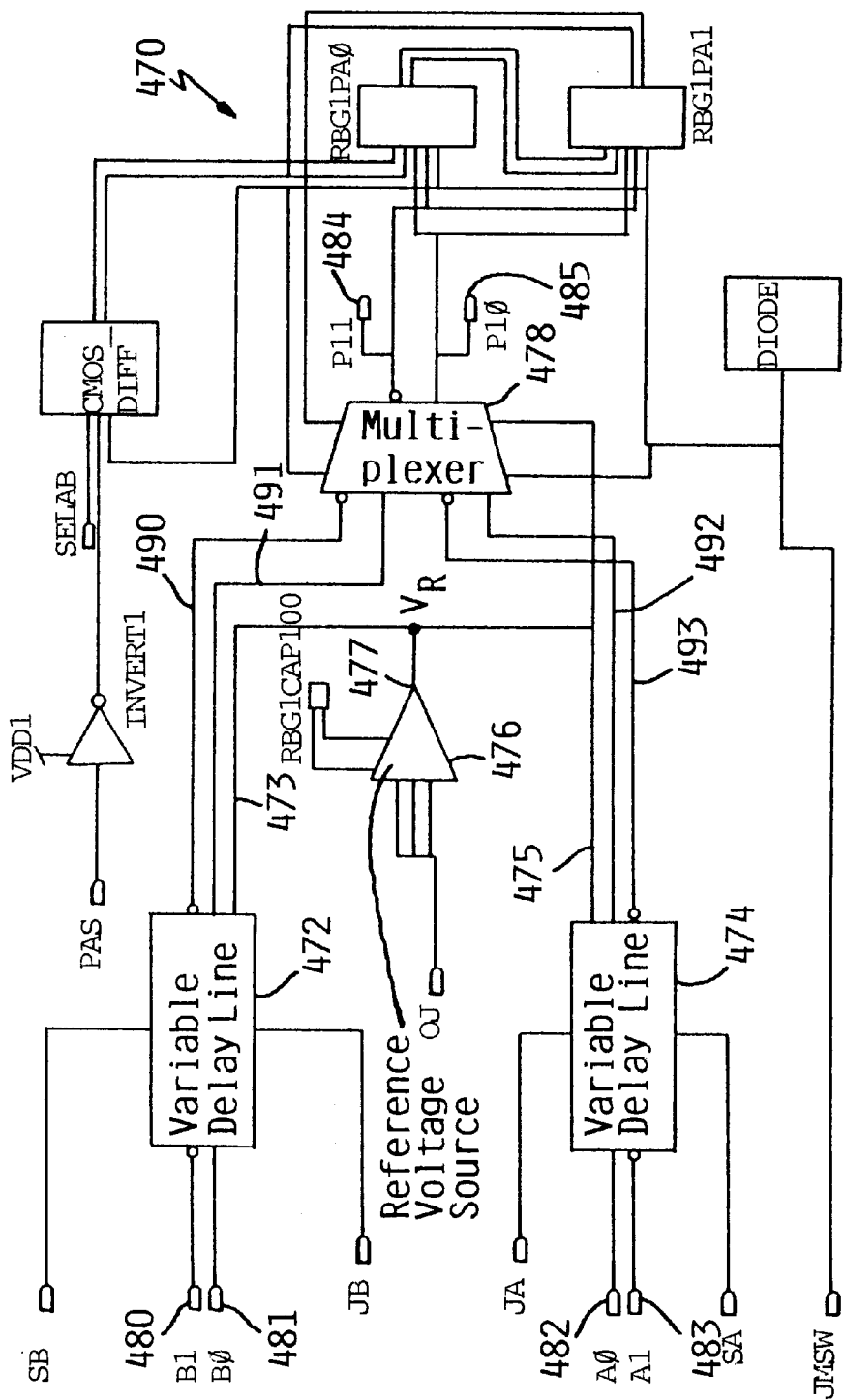
FIG. 14 is a schematic of a pair of delay lines, each of which is supplied a reference voltage signal at a constant amplitude, with respect to the power supply, by an operational amplifier in accordance with an embodiment of the present invention.

FIG. 14 illustrates in schematic form a circuit 470 including a reference voltage source 476 respectively coupled to two variable delay lines 472, 474 of the type previously described. In this particular embodiment, a differential input signal is applied to delay lines 472 and 474 via differential signal inputs 480, 481 and 482, 483, respectively. Differential signals selectively propagated through delay lines 472, 474 are transmitted to a multiplexer 478 via conductors 490, 491 and 492, 493, which, in turn, selectively couples conductors 490, 491 and 492, 493 to differential signal outputs 484, 485 of multiplexer 478.

It is understood that fluctuations in the amplitude of reference voltage signals supplied to a delay line or delay element typically introduces jitter in the differential input signal propagated through the delay line or delay element, which represents an undesirable variation in signal periodicity. Reference voltage source 476 provides reference voltage signals of a constant amplitude with respect to the power supply to delay lines 472 and 474 via conductors 473 and 475, respectively, resulting in reduced jitter and skew in the differential input signal operated on by the delay lines 472, 474.

Figure 15:
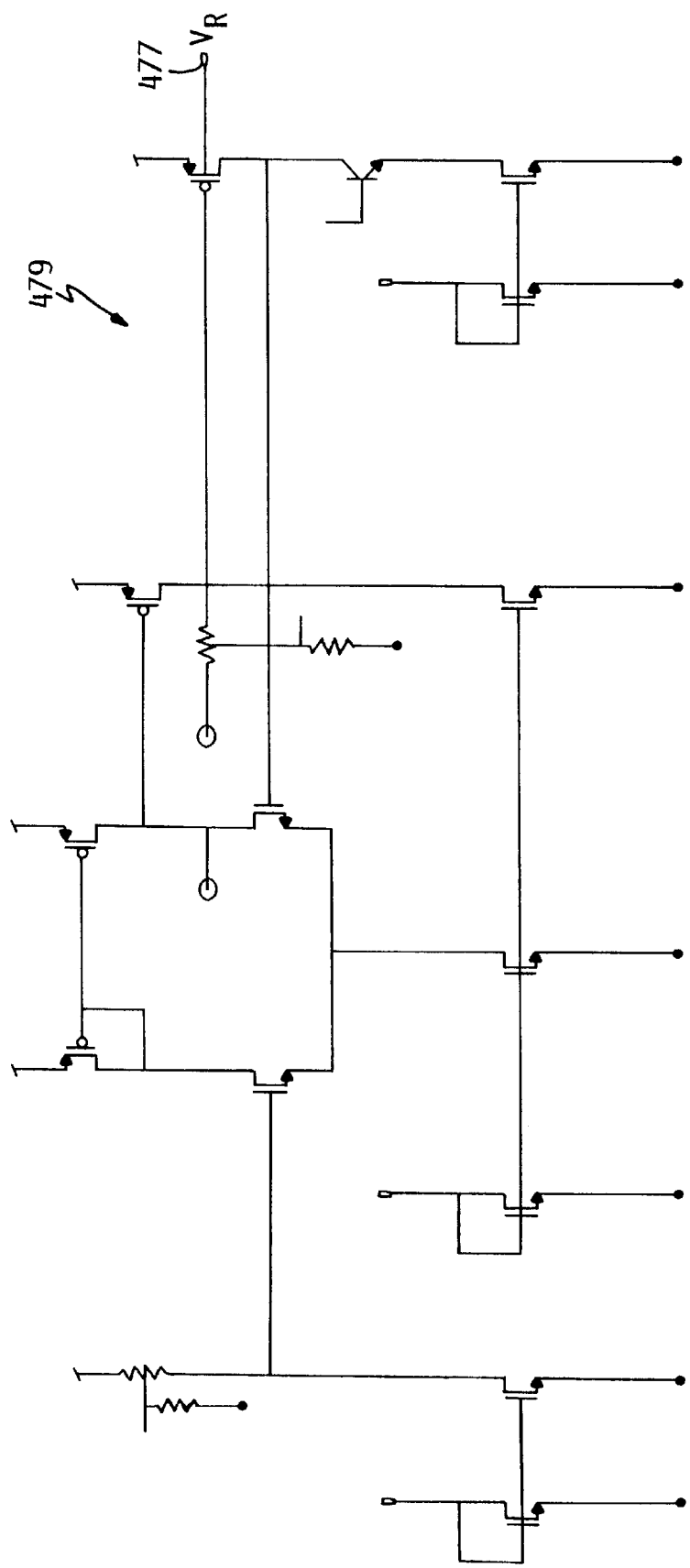
FIG. 15 is a schematic of the operational amplifier of FIG. 14.

In one embodiment of the present invention, reference voltage source 476 includes the operational amplifier (op-amp) circuit 479 shown in FIG. 15. In accordance with this embodiment, op-amp circuit 479 controls the swing amplitude of the reference voltage, VR, produced at output 477 so as to maintain the reference voltage at a substantially constant amplitude with respect to the power supply, such as 450 mV for example. The reference voltage signal of constant amplitude produced at output 477 of op-amp circuit 479 is provided to the gates of the P-FET load elements shown in FIG. 11, for example, as determined by delay line circuit control logic.

Figure 16:
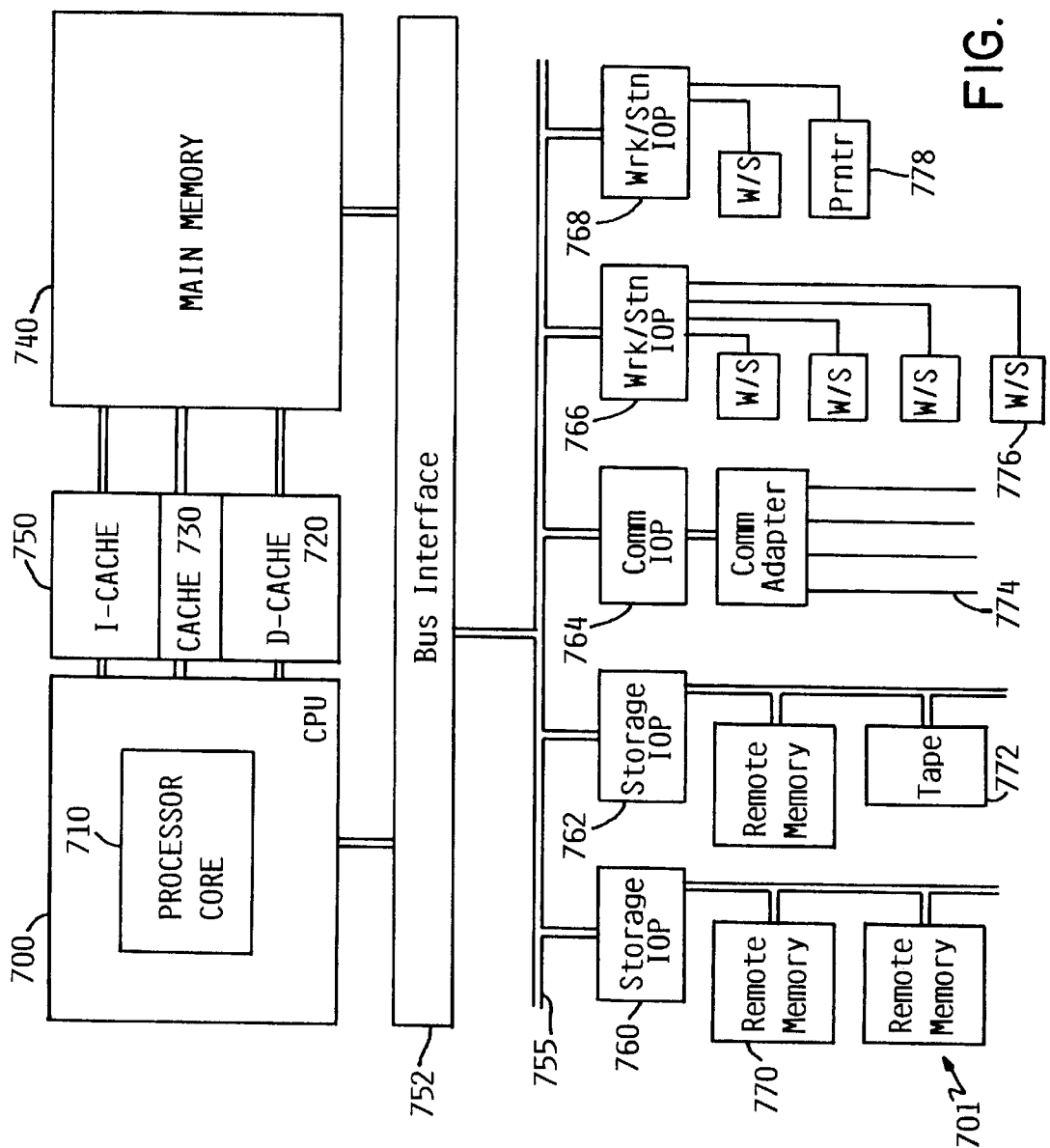
FIG. 16 is a system block diagram of a computer data processing system within which the apparatus and methodology of the present invention may be implemented.

With reference to FIG. 16, there is depicted a high level block diagram of a computer data processing system 701 which may be utilized to implement the systems and methodologies of the present invention. The primary hardware components and interconnections of a computer data processing system 701 capable of utilizing the present invention include a central processing unit (CPU) 700 for processing instructions. CPU 700 is coupled to caches 720, 730, and 750. Instruction cache 750 stores instructions for execution by CPU 700. Data cache 720 stores data to be used by CPU 700, and cache 730 can store both data and instructions to be used by the CPU 700, e.g., cache 730 can be an L2 cache.

The caches communicate with random access memory in main memory 740. CPU 700 and main memory 740 also communicate via bus interface 752 with system bus 755. Various input/output processors (IOPs) 760-168 attach to system bus 755 and support communication with a variety of storage and input/output (I/O) devices, such as remote memory devices 770 (e.g., direct access storage devices (DASD)), tape drives 772, remote communications lines 774, workstations 776, and printers 778. It should be understood that FIG. 16 is intended to depict representative components of a computer data processing system 701 at a high level, and that the number and types of such components may vary.

Within the CPU 700, a processor core 710 contains specialized functional units, each of which perform primitive operations, such as sequencing instructions, executing operations involving integers, executing operations involving real numbers, transferring values between addressable storage and logical register arrays. The data processing system 701 includes various units, registers, buffers, memories, and other sections which are all preferably formed by integrated circuitry. The processor core 710 of the data processing system 701 may constitute a single integrated circuit, pipelined, superscalar microprocessor, which may be implemented utilizing any computer architecture such as the family of RISC processors sold under the trade name Power™ microprocessor chip sold by IBM. The data processing system 701 can operate according to reduced instruction set computing, RISC, techniques or other computing techniques.

The foregoing description of the various embodiments of the invention has been presented for the purposes of illustration and description. It is not intended to be exhaustive or to limit the invention to the precise form disclosed. Many modifications and variations are possible in light of the above teaching. For example, the principles of the present invention may be applied in circuitry in which signals other than differential signals or clock are processed, such as single-ended signals of varying types. The principles of the present invention may be applied in circuitry disposed on a signal wafer or on multiple wafers, and is not limited to use only in multiple system card implementations. Various digital aspects of the disclosed embodiments may be implemented using analog techniques. Further, the disclosed circuitry may be implemented using any suitable technology, and is not limited to a CMOS technology. It is intended that the scope of the invention be limited not by this detailed description, but rather by the claims appended hereto.

What is claimed is:

1. A method of distributing a signal to a plurality of receiving devices, comprising:

producing a plurality of delayed signals each having a respective delay relative to a system clock signal;

transmitting each of the delayed signals to a respective one of the plurality of receiving devices; and adjusting the delay of each of the delayed signals using a reference signal having a delay relative to the system clock signal and an output signal provided by each receiving device such that each of the delayed signals is received by the respective receiving devices at approximately the same time wherein the reference signal has longer delay time than the delayed signals.

2. The method of claim 1, wherein the reference signal comprises a signal having a fixed delay relative to the system clock signal.

3. The method of claim 1, wherein adjusting each of the delayed signals comprises adjusting a phase of each of the delayed signals to a substantially in-phase relationship with respect to the reference signal in response to a phase difference between the reference signal and each of the respective output signals.

4. The method of claim 1, wherein the output signals comprise data signals.

5. The method of claim 1, wherein the delayed signals and the output signals respectively comprise low voltage differential signals or CMOS level signals.

6. The method of claim 1, wherein the method of distributing the signal is selectable between an adaptive mode of operation and a slave mode of operation.

7. The method of claim 1, wherein a delay associated with the reference signal is longer than a delay associated with each of the delayed signals.

8. The method of claim 1, wherein adjusting the delay of the delayed signals comprises digitally adjusting the phase of each of the delayed signals.

9. The method of claim 1, wherein producing each of the delayed signals comprises:

selecting between one of a first delay line or a second delay line;

producing the delayed signal using the selected first or second delay line; and changing a delay factor of the other one of the first or second delay lines by varying a resistance and a current of one or more delay elements of the other one of the first or second delay lines.

10. The method of claim 9, further comprising providing a reference voltage having a substantially constant amplitude to the one or more delay elements.

11. An adaptive clock distribution circuit, comprising:

a master module comprising a fixed delay line and a plurality of variable delay line circuits, the fixed delay line and each of the variable delay line circuits receiving a system clock signal, the fixed delay line producing a delayed clock signal;

a primary slave module coupled to the master module, the primary slave module receiving the delayed clock signal from the fixed delay line and producing a reference clock signal; and a plurality of secondary slave modules each coupled to one or more logic devices, each of the secondary slave modules receiving a variable clock signal from one of the variable delay line circuits and producing a slave output signal, the master module adjusting the variable clock signal received by each of the secondary slave modules so as to substantially align with the reference clock signal in response to a phase difference between respective slave output signals and the reference clock signal.

12. The circuit of claim 11, wherein the slave output signals comprise data signals.

13. The circuit of claim 11, wherein the variable clock signals and the slave output signals respectively comprise low voltage differential signals or CMOS level signals.

14. The circuit of claim 11, wherein the primary slave module is coupled to one or more logic devices.

15. The circuit of claim 11, wherein the variable clock signal received by each of the secondary slave modules is used for clocking the respective logic devices.

16. The circuit of claim 11, wherein the circuit is disposed on a signal wafer or on a plurality of wafers.

17. The circuit of claim 11, wherein the circuit is operative in a slave mode of operation or an adaptive mode of operation.

18. The circuit of claim 11, wherein fixed delay line has a delay factor longer than a delay factor associated with each of the variable delay line circuits.

19. The circuit of claim 11, wherein the master module further comprises a plurality of control circuits and a plurality of phase detectors, each of the control circuits coupled to one of the variable delay line circuits and one of the phase detectors, and each of the phase detectors receiving the reference clock signal from the primary slave module and a slave output signal from one of the secondary slave modules.

20. The circuit of claim 11, wherein each of the variable delay line circuits comprises a first delay line, a second delay line, and a multiplexer coupled to respective outputs of the first and second delay lines.

21. The circuit of claim 11, wherein each of the variable delay line circuits comprises:

a first delay line including a plurality of delay elements;

a second delay line including a plurality of delay elements;

a multiplexer coupled to respective outputs of the first and second delay lines, the multiplexer selectively coupling the output of one of the first or second delay lines to an output of the multiplexer;

a reference voltage source coupled to each of the delay elements, the reference voltage source providing a reference voltage at a substantially constant amplitude to each of the delay elements; and a control circuit coupled to the multiplexer and the first and second delay lines, the control circuit controlling the multiplexer so as to produce a variable clock signal at the multiplexer output using one of the first or second delay lines, and changing a delay factor of the other one of the first or second delay lines by varying a resistance and a current of one or more delay elements of the other one of the first or second delay lines.

22. The circuit of claim 11, wherein the circuit is a digital clock distribution circuit.

23. A circuit for distributing a signal, comprising:

means for producing a plurality of signals each having a respective delay;

means for transmitting each of the delayed signals to a respective one of the plurality of receiving devices; and means for adjusting the delay of each of the delayed signals using a reference signal and an output signal provided by each receiving device such that each of the delayed signals is received by the respective receiving devices at approximately the same time, a delay associated with the reference signal being longer than a delay associated with each of the delayed signals.

24. The circuit of claim 23, wherein the output signals comprise data signals.

25. The circuit of claim 23, wherein the delayed signals and the output signals respectively comprise low voltage differential signals or CMOS level signals.

26. The circuit of claim 23, wherein the circuit is selectably operable in a slave mode of operation or an adaptive mode of operation.

27. The circuit of claim 23, wherein the adjusting means comprises means for digitally adjusting the phase of each of the delayed signals.

28. The circuit of claim 23, wherein the producing means comprises:
- means for selecting between one of a first delay line or a second delay line of a plurality of delay line circuits;
- means for producing each of the delayed signals using the selected first or second delay line of a respective delay line circuit; and
- means for changing a delay factor of the other one of the first or second delay lines of the respective delay line circuit by varying a resistance and a current of one or more delay elements of the other one of the first or second delay lines.

29. The circuit of claim 28, further comprising means for providing a reference voltage having a substantially constant amplitude to the one or more delay elements.

30. A computer system, comprising:
- a central processing unit;
- system memory coupled to the central processing unit;
- an input/output interface coupled to the central processing unit for interfacing with one or more external components; and
- a clock signal distribution circuit comprising:
  - a master module comprising a fixed delay line and a plurality of variable delay line circuits, the fixed delay line and each of the variable delay line circuits receiving a system clock signal, the fixed delay line producing a delayed clock signal;
  - a primary slave module coupled to the master module, the primary slave module receiving the delayed clock signal from the fixed delay line and producing a reference clock signal; and
  - a plurality of secondary slave modules each coupled to one or more logic devices, each of the secondary slave modules receiving a variable clock signal from one of the variable delay line circuits and producing a slave output signal, the master module adjusting the variable clock signal received by each of the secondary slave modules so as to substantially align with the reference clock signal in response to a phase difference between respective slave output signals and the reference clock signal.

31. The system of claim 30, wherein the variable clock signals and the slave output signals respectively comprise low voltage differential signals or CMOS level signals.

32. The system of claim 30, wherein the circuit is disposed on a signal wafer or on a plurality of wafers.

33. The system of claim 30, wherein the circuit is operative in a slave mode of operation or an adaptive mode of operation.

34. The system of claim 30, wherein fixed delay line has a delay factor longer than a delay factor associated with each of the variable delay line circuits.

35. The circuit of claim 30, wherein the master module further comprises a plurality of control circuits and a plurality of phase detectors, each of the control circuits coupled to one of the variable delay line circuits and one of the phase detectors, and each of the phase detectors receiving the reference clock signal from the primary slave module and a slave output signal from one of the secondary slave modules.

36. The system of claim 30, wherein each of the variable delay line circuits comprises a first delay line, a second delay line, and a multiplexer coupled to respective outputs of the first and second delay lines.

37. The system of claim 30, wherein each of the variable delay line circuits comprises:
- a first delay line including a plurality of delay elements;
- a second delay line including a plurality of delay elements;
- a multiplexer coupled to respective outputs of the first and second delay lines, the multiplexer selectively coupling the output of one of the first or second delay line s to an output of the multiplexer;
- a reference voltage source coupled to each of the delay elements, the reference voltage source providing a reference voltage at a substantially constant amplitude to each of the delay elements; and
- a control circuit coupled to the multiplexer and the first and second delay lines, the control circuit controlling the multiplexer so as to produce a variable clock signal at the multiplexer output using one of the first or second delay lines, and changing a delay factor of the other one of the first or second delay lines by varying a resistance and a current of one or more delay elements of the other one of the first or second delay lines.

* * * * *

UNITED STATES PATENT AND TRADEMARK OFFICE
CERTIFICATE OF CORRECTION

PATENT NO.    : 6,232,806 B1
DATED         : May 15, 2001
INVENTOR(S)   : Dana Marie Woeste; James David Strom; Bruce George Rudolph It is certified that error appears in the above-identified patent and that said Letters Patent is hereby corrected as shown below:

<u>Column 18, claim 37,</u>
Line 36, "line s" should be -- lines --.

Signed and Sealed this

Thirteenth Day of November, 2001

Attest:

*Attesting Officer*

NICHOLAS P. GODICI
*Acting Director of the United States Patent and Trademark Office*